United States Patent [19]
Kuwahara et al.

[11] Patent Number: 5,565,766
[45] Date of Patent: Oct. 15, 1996

[54] SEMICONDUCTOR CIRCUIT ELEMENT DEVICE WITH ARRANGEMENT FOR TESTING THE DEVICE AND METHOD OF TEST

[75] Inventors: Hiroichi Kuwahara; Kiyoyuki Yoshida; Kazuyuki Iida, all of Kawasaki, Japan

[73] Assignee: Fujitsu Limited, Kanagawa, Japan

[21] Appl. No.: 952,651

[22] Filed: Sep. 28, 1992

[30] Foreign Application Priority Data

Sep. 30, 1991 [JP] Japan .................................. 3-251074

[51] Int. Cl.$^6$ ............................ G01R 31/02; G06F 11/22
[52] U.S. Cl. ...................... 324/158.1; 324/763; 324/72.5
[58] Field of Search ................................. 371/22.3, 22.6; 324/158 R, 756–762

[56] References Cited

U.S. PATENT DOCUMENTS

| | | | |
|---|---|---|---|
| 4,746,855 | 5/1988 | Wrinn | 324/763 |
| 4,841,233 | 6/1989 | Yoshida | 324/73 R |
| 4,975,641 | 12/1990 | Tanaka et al. | 324/763 |

FOREIGN PATENT DOCUMENTS

| | | |
|---|---|---|
| 2-32270 | 2/1990 | Japan . |
| 2-32271 | 2/1990 | Japan . |

*Primary Examiner*—Kenneth A. Wieder
*Assistant Examiner*—Barry C. Bowser
*Attorney, Agent, or Firm*—Staas & Halsey

[57] ABSTRACT

A semiconductor circuit element device with an arrangement for testing the device including a plurality of first logic circuits provided in correspondence with internal line groups which are formed by grouping the internal lines into a plurality of groups, a plurality of internal lines belonging to a group in question constituting the input lines of the plurality of first logic circuits, for outputting an active output signal when all of the inputs represent active signals and outputting an inactive output signal when at least one of the inputs represents an inactive signal; and a second logic circuit constituted by one or more stages of circuit structures, for receiving the outputs of the first logic circuits and sending out an output signal such that the output signal in the case where all of the inputs are inactive output signals is different from the output signal in the case where at least one of the inputs is an active output signal.

31 Claims, 34 Drawing Sheets

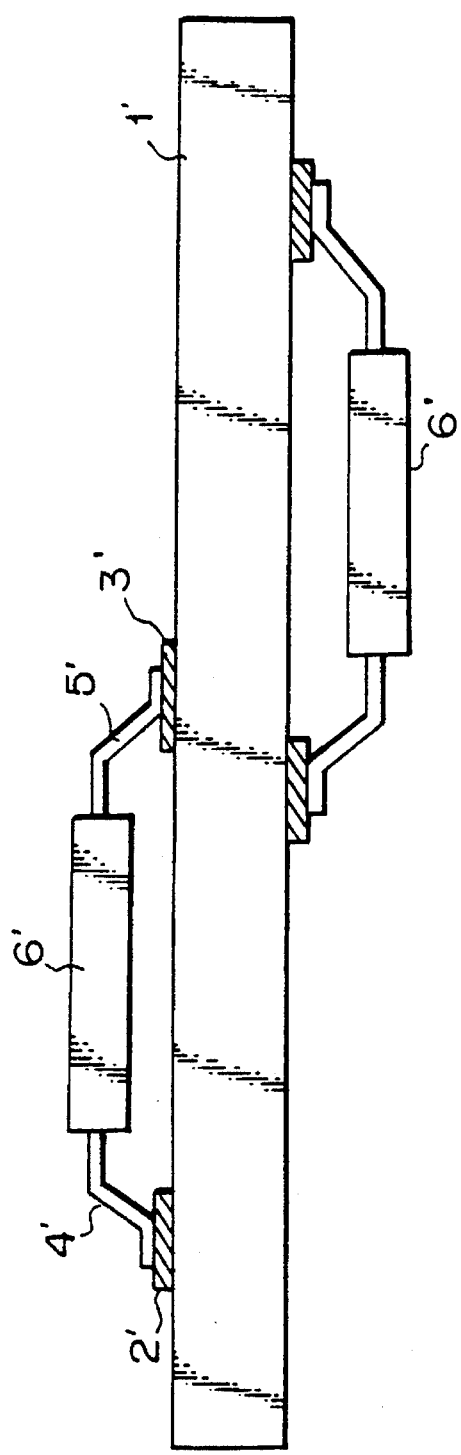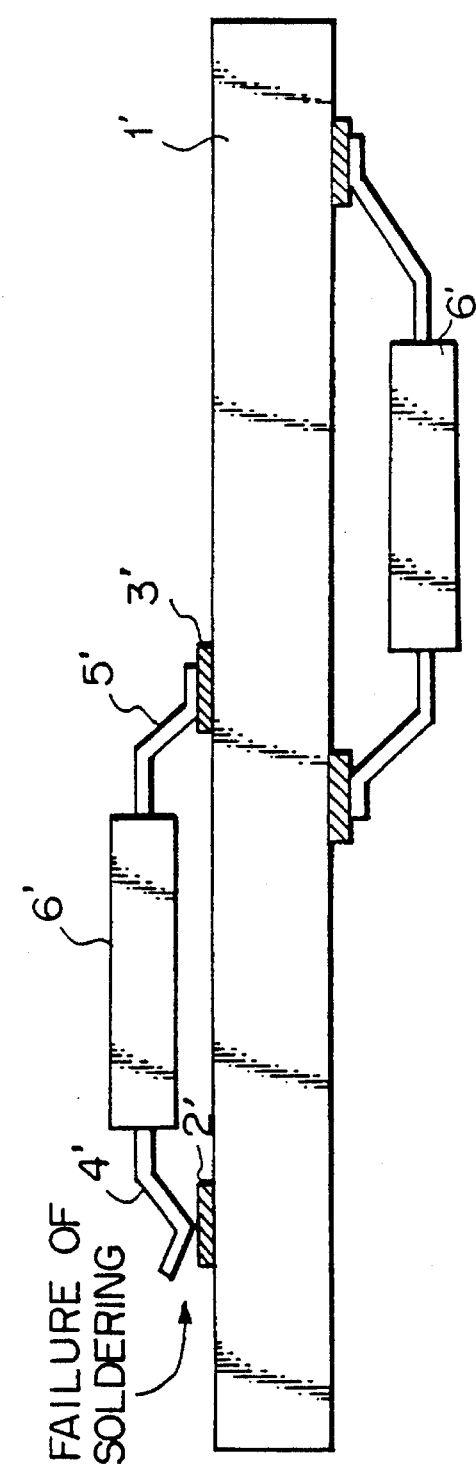

Fig. 5A
FIRST LOGIC CIRCUIT
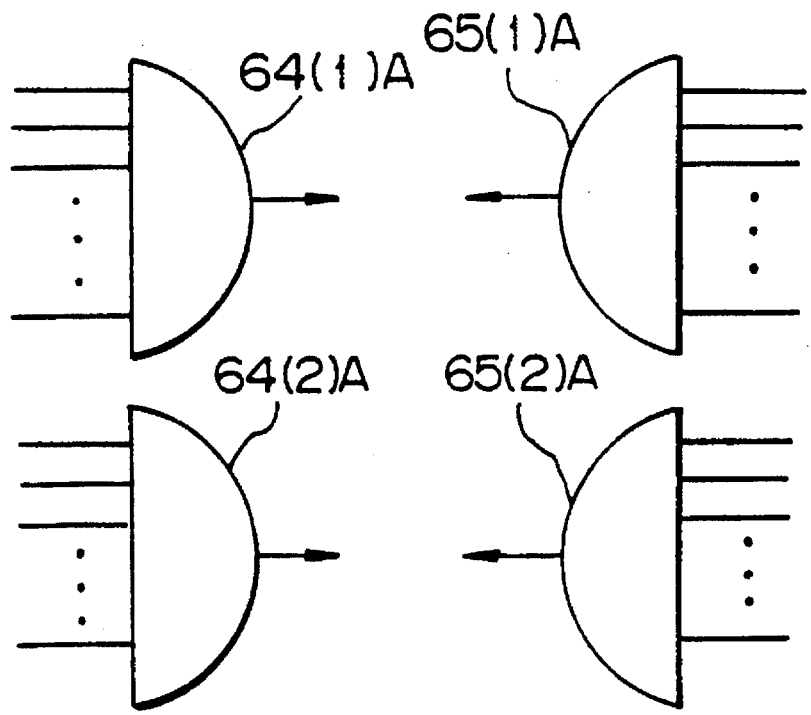
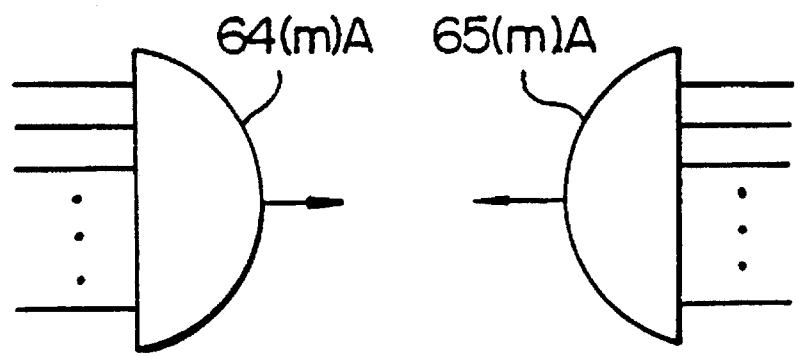

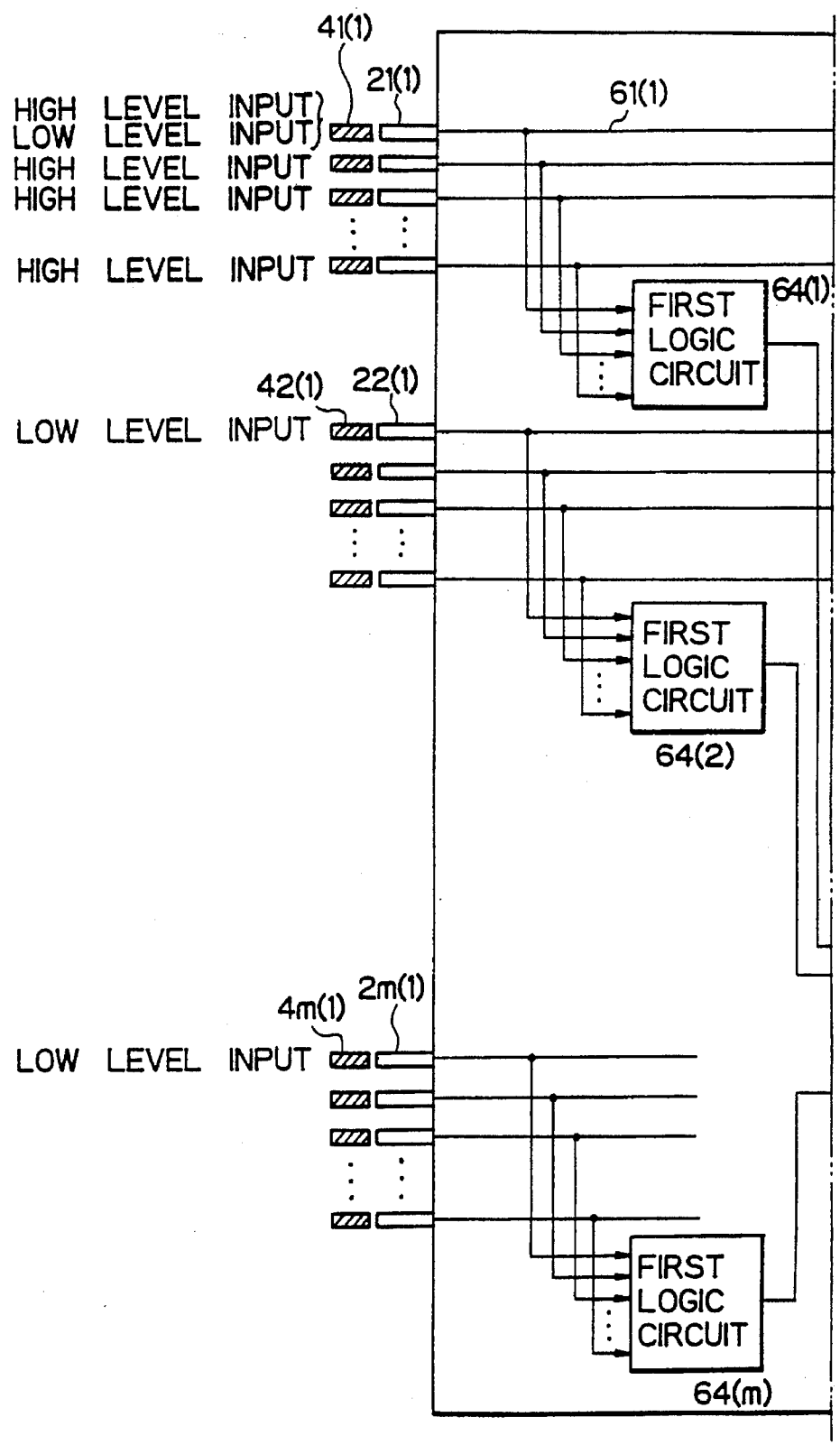

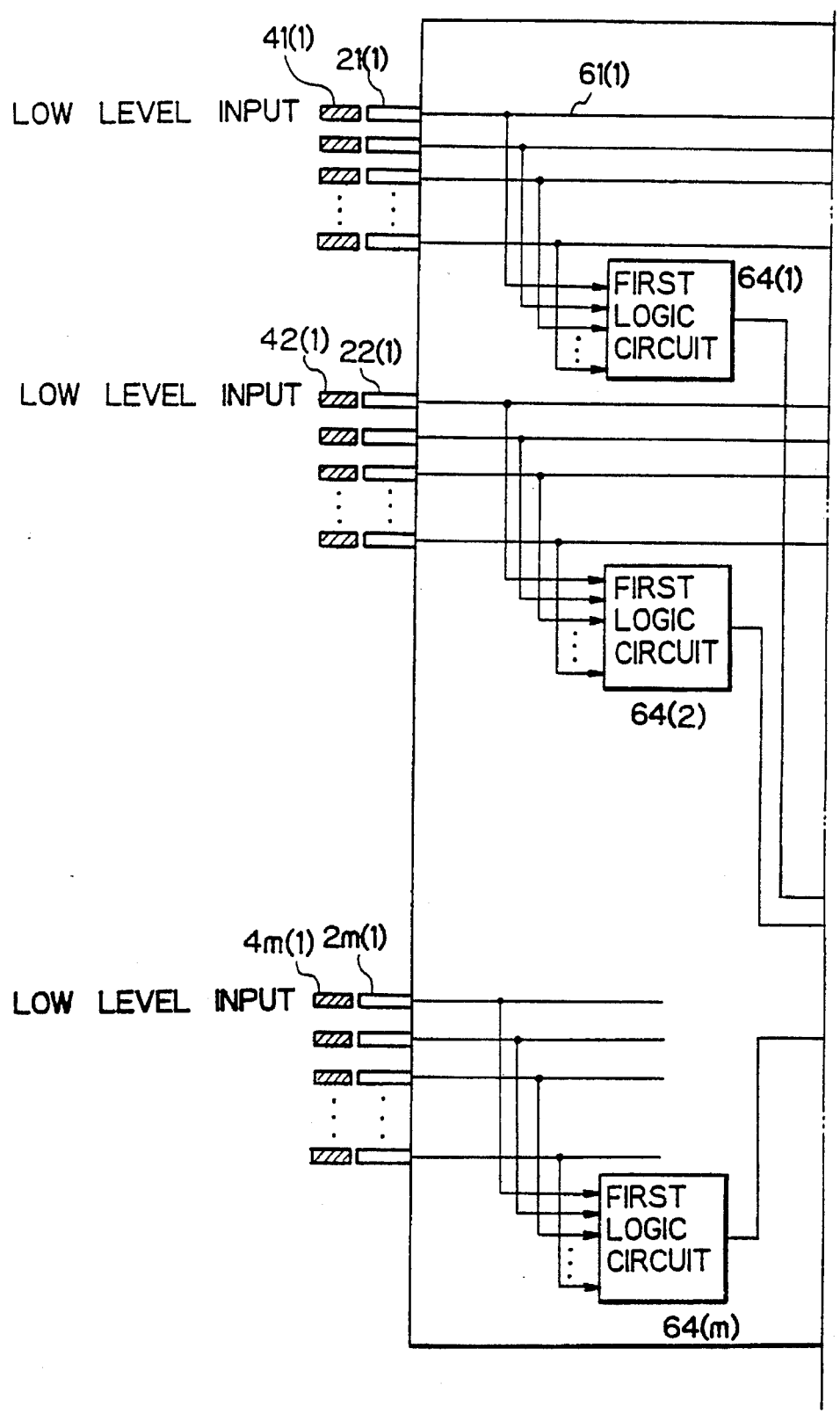

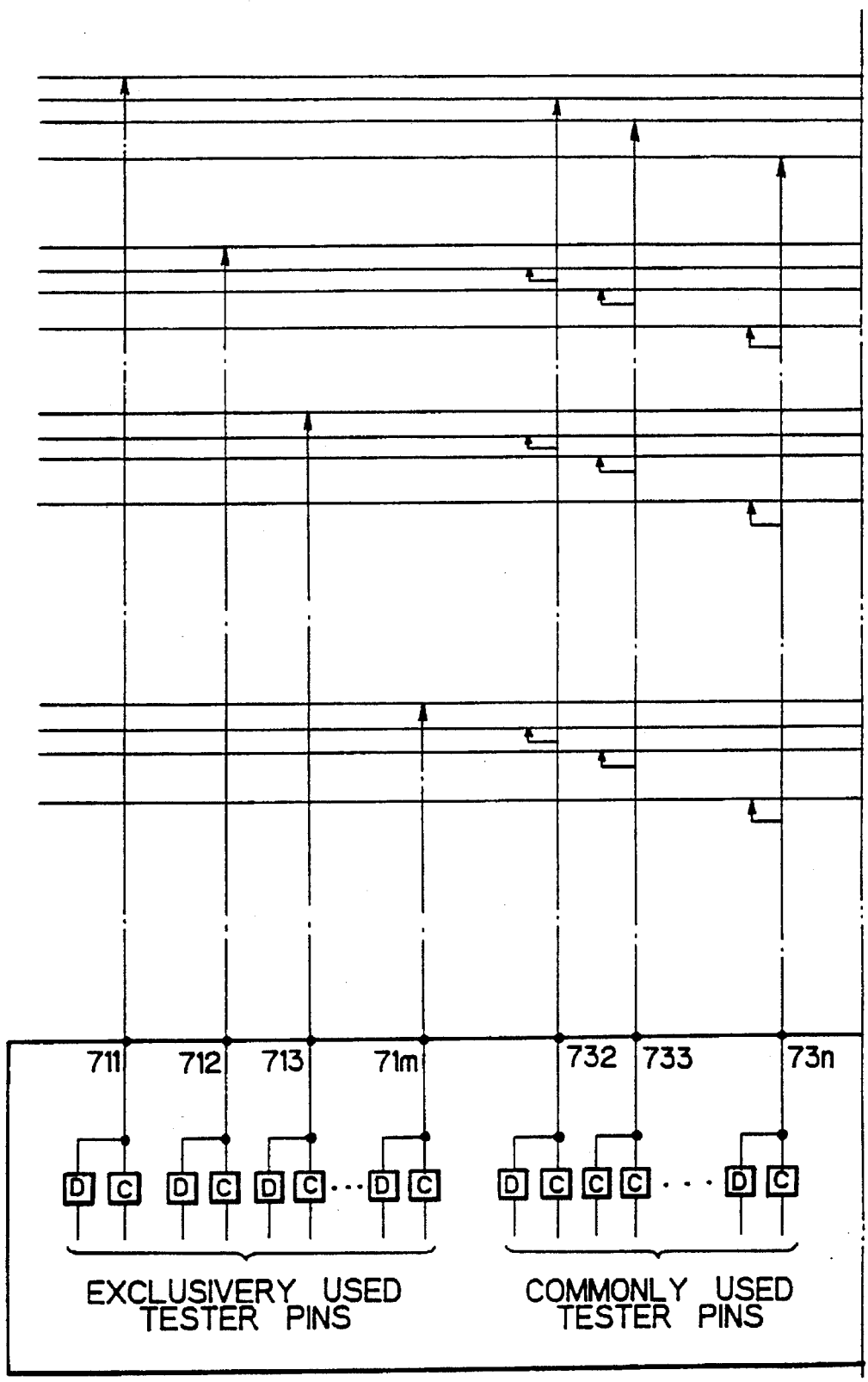

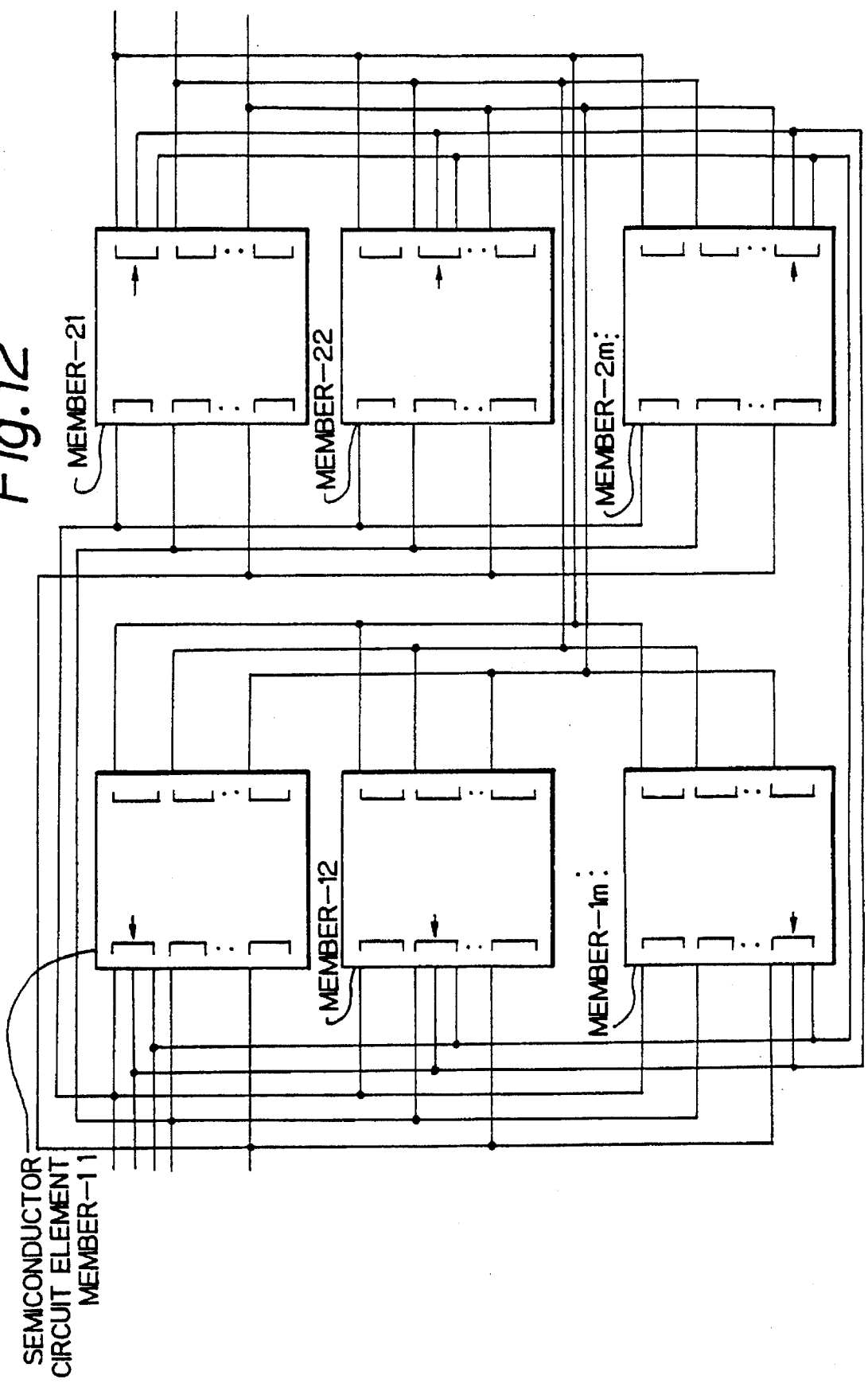

FIRST PROCESS

SECOND PROCESS

SEMICONDUCTOR CIRCUIT ELEMENT DEVICE WITH ARRANGEMENT FOR TESTING THE DEVICE AND METHOD OF TEST

BACKGROUND OF THE INVENTION

1. Field of the Invention

The present invention relates to a semiconductor circuit element device with an arrangement for testing the device and a method of testing the state of connection between external pins of the device and conductor connecting portions on a printed circuit board.

The device and method according to the present invention are applicable to the test of a semiconductor circuit element device mounted on a printed circuit board by surface mount technology (SMT).

2. Description of the Related Art

In surface mount technology (SMT), a large-scale integrated circuit (LSI) is mounted on an SMT type printed circuit board by soldering surface mount device type lead conductors of the LSI to "foot prints", or conductor connecting portions, provided on the board. Since it is possible to mount LSI's on both sides of a printed circuit board by surface mount technology, the density of LSI's on the board is increased.

When mounting semiconductor circuit element devices on a printed circuit board by surface mount technology, there are frequent failures of soldering of the lead conductors of the devices to the "foot prints". Accordingly, it is necessary to test the manufactured semiconductor circuit element devices with the printed circuit board.

Recently, along with the increase of the number of the gates of LSI's, the number of the lead conductors of LSI's has increased. The difficulty of the above test has increased accordingly.

In order for the prior art in-circuit tester for semiconductor circuit element devices to handle surface mount device type LSI's having an increased number of lead conductors, such as LSI's of the small outline package (SOP) type or the quad flat package (QFP) type, the tester would have to be made much more complex, making it expensive.

Returning to the above test, failure of soldering of the lead conductors of semiconductor circuit element devices to the "foot prints" on the printed circuit board is detected by supplying test pattern signals to the devices through a probe pin through probe points on the devices connected to input pins, picking up pattern signals which are processed by a system circuit in devices in correspondence with supplied test pattern signals, from the devices through a probe pin through probe points on the devices connected to output pins, comparing the supplied test pattern signals and the picked processed pattern signals. The failure of soldering is determined based on the comparison of the signals.

However, as the number of the gates of the devices increases, the work of making the test pattern necessary for the test tends to be more time-consuming and elaborate, so the testing of manufactured semiconductor circuit element devices becomes difficult. In view of the increase of the kinds of LSI's developed and the reduction of the life of LSI products, the above-mentioned difficulty is beginning to be considered a serious obstacle.

SUMMARY OF THE INVENTION

An object of the present invention is to provide an improved semiconductor circuit element device with an arrangement for testing the device and a method of testing the states of the connection between the external pins of the device and the conductor connecting portions on the printed circuit board with high precision by using relatively simple means which use simple regular test pattern signals supplied to the device and by providing a logic circuit of a relatively simple structure without a substantial increase in the number of gates of the device.

In accordance with the present invention, there is provided a semiconductor circuit element device with an arrangement for testing the device. The semiconductor circuit element has a plurality of external pins to be connected to conductor connecting portions on a printed circuit board and a system circuit is connected to internal lines to be connected to the external pins for carrying out predetermined processing of signals. The semiconductor circuit element device includes a plurality of first logic circuits provided in correspondence with internal line groups formed by grouping the internal lines into a plurality of groups, a plurality of internal lines belonging to a group in question constituting the input lines of the plurality of first logic circuits, for outputting an active output signal when all of the inputs represent active signals and outputting an inactive output signal when one or more of the inputs represents an inactive signal; and a second logic circuit constituted by one or more stages of circuit structures, for receiving the outputs of the first logic circuits and sending out an output signal such that the output signal when all of the inputs are inactive output signals is different from the output signal when one or more of the inputs is an active output signal. The arrangement for testing the device is adapted to carry out a group selection process for selecting one group of the group to be tested from the groups of internal lines; an inactive signal supply process for supplying inactive signals through the conductor connecting portions to at least one internal line in the lines of the groups which are not selected in the group selection process; an active signal supply responsive output signal checking process for supplying active signals through the conductor connecting portions to the internal lines of the group selected in the group selection process and checking the signal output from the semiconductor circuit element device in response to the supply of the active signals, and an inactive signal supply responsive output signal checking process for selecting internal lines successively from the internal line of the group selected in the group selection process, supplying inactive signals through the conductor connecting portions to the selected internal lines, supplying active signals through the conductor connecting portions to the remaining internal lines, and checking the signal output from the semiconductor circuit element device in response to the supply of the inactive and active signals.

BRIEF DESCRIPTION OF THE DRAWINGS

FIG. 1 shows a general arrangement of semiconductor circuit element devices on a printed circuit board to which the present invention is applicable;

FIG. 2 illustrates a problem of the failure of soldering of an external pin to the conductor connecting portion on the printed circuit board;

FIGS. 4, 4A–4C show the structure of a semiconductor circuit element device with an arrangement for testing the device according to an embodiment of the present invention;

FIGS. 5A and 5B show examples of the logic circuits used in the semiconductor circuit element device shown in FIG. 4;

FIGS. 6, 6A–6B show a modification of the semiconductor circuit element device according to an embodiment of the present invention;

FIGS. 7, 7A–7B illustrate the test of the connection between the control pin and the conductor connecting portion;

FIGS. 9, 9A–9C illustrate the test of the connections between the input pins and the conductor connecting portions;

FIGS. 10, 10A–10C illustrate the test of the connections between the output pins and the conductor connecting portions;

FIGS. 11, 11A–11C illustrate the operation of the test of the semiconductor circuit element device in connection with the semiconductor test operation unit;

FIG. 12 illustrates an assembly of semiconductor circuit element devices for using an assignment software on the market;

FIGS. 13A1–13B2 illustrate an example of processes of a test of a semiconductor circuit element device according to an embodiment of the present invention.

DESCRIPTION OF THE PREFERRED EMBODIMENTS

Figure 3A:
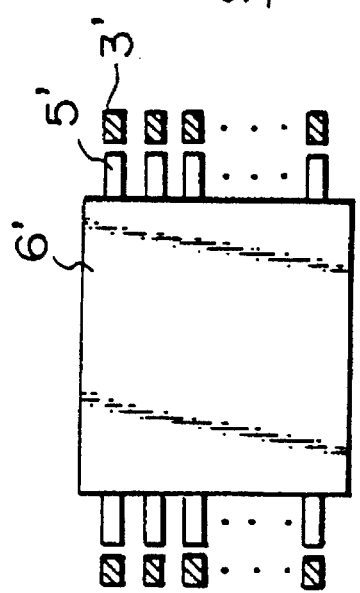
FIG. 3A and 3B show arrangements of external pins for semiconductor circuit element devices of the small outline package type and the quad flat package type.
Figure 3B:
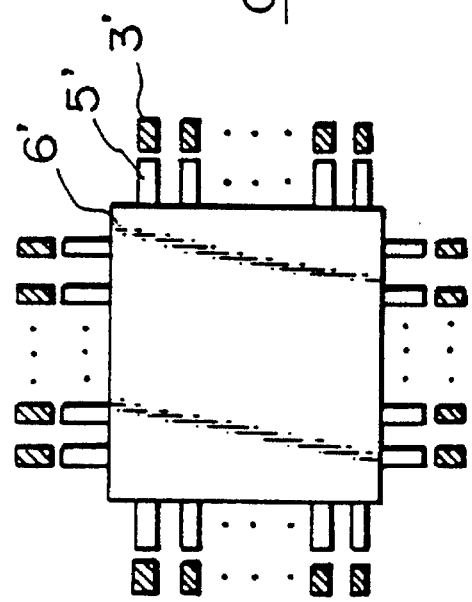
Figures 1, 13A:
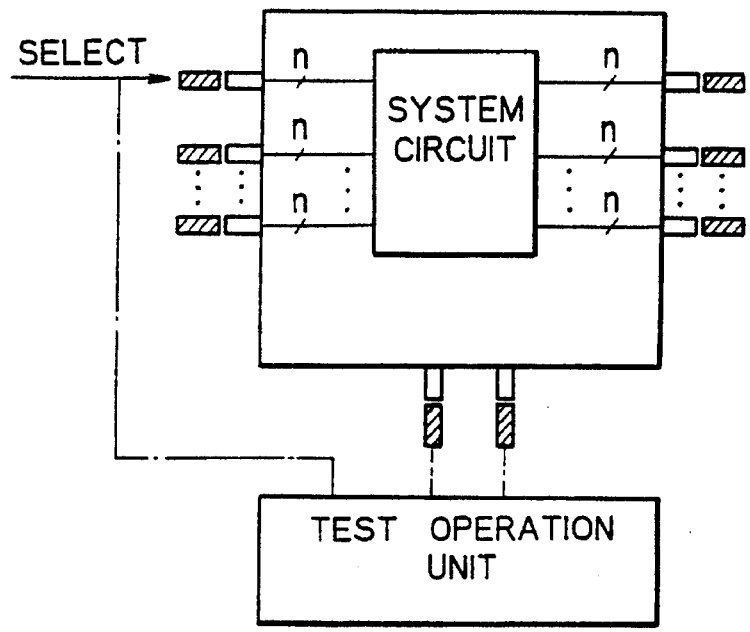
Figures 2, 13A:
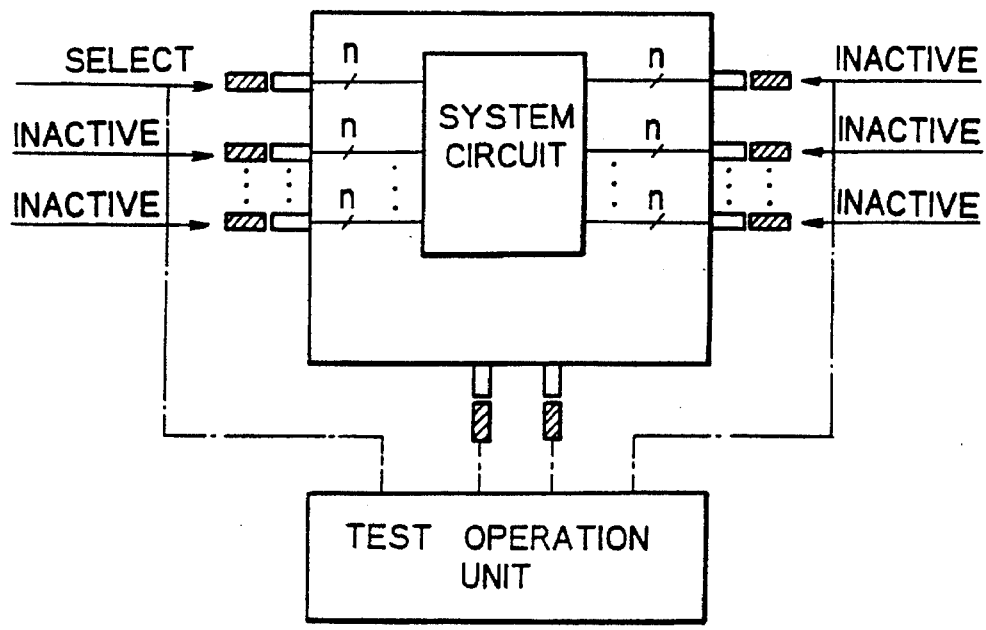
Figures 1, 13B:
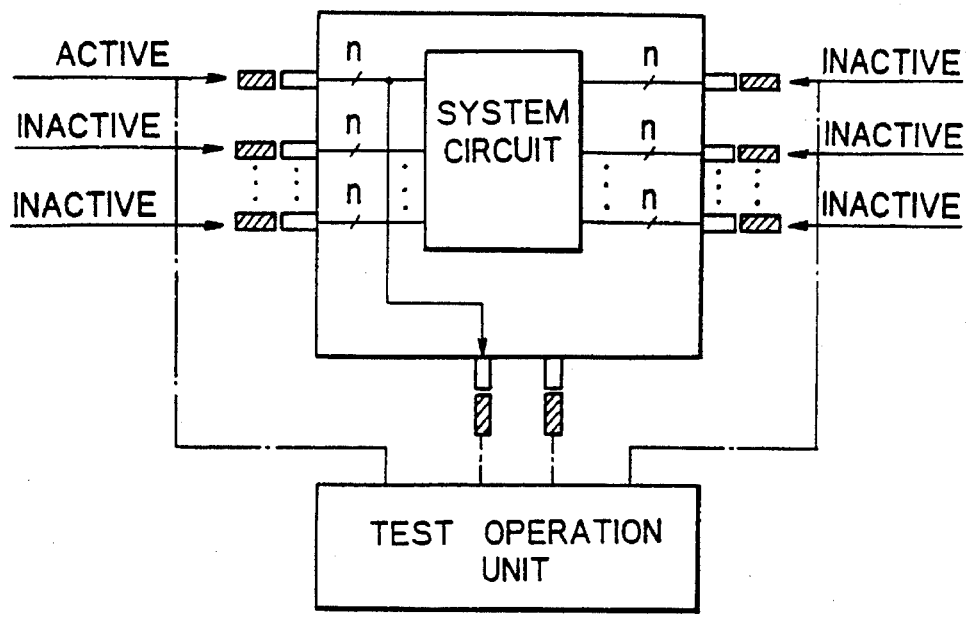
Figures 2, 13B:
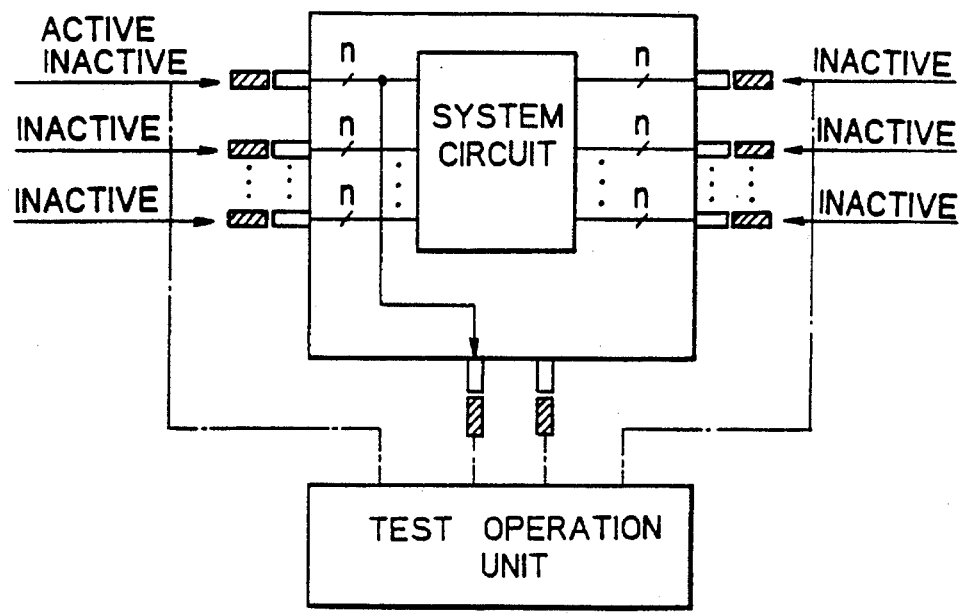

Before describing the preferred embodiments of the present invention, examples of the semiconductor circuit element device to which the present invention is applicable are illustrated in FIGS. 1, 2, 3A, and 3B. FIG. 1 shows an example of an LSI of the surface mount device type, constituted by a printed circuit board 1', "foot prints" (or conductor connecting portions) 2', and 3', provided on the printed circuit board, an LSI 6', and external pins (or lead conductors) 4' and 5', provided in the LSI. The external pins 4', 5' are to be soldered to the "foot prints" 2', 3'. LSI's can be arranged on both sides of the printed circuit board 1'. However, in the prior art mounting of LSI's on a printed circuit board by the surface mount technology, as shown in FIG. 2, there are frequent failures of soldering of the external pins of the LSI to the "foot prints" on the printed circuit board. Therefore, it is necessary to test the manufactured LSI. Recently, along with the increase of the number of gates of LSI's the number of the external pins of LSI's has been increasing. For the prior art in-circuit tester for LSI's to handle testing of LSI's having an increased number of external pins, such as LSI's of the small outline package (SOP) type as shown in FIG. 3A or the quad flat package (QFP) type as shown in FIG. 3B, the tester would have to be much more complex, making it more expensive.

Figure 4A:
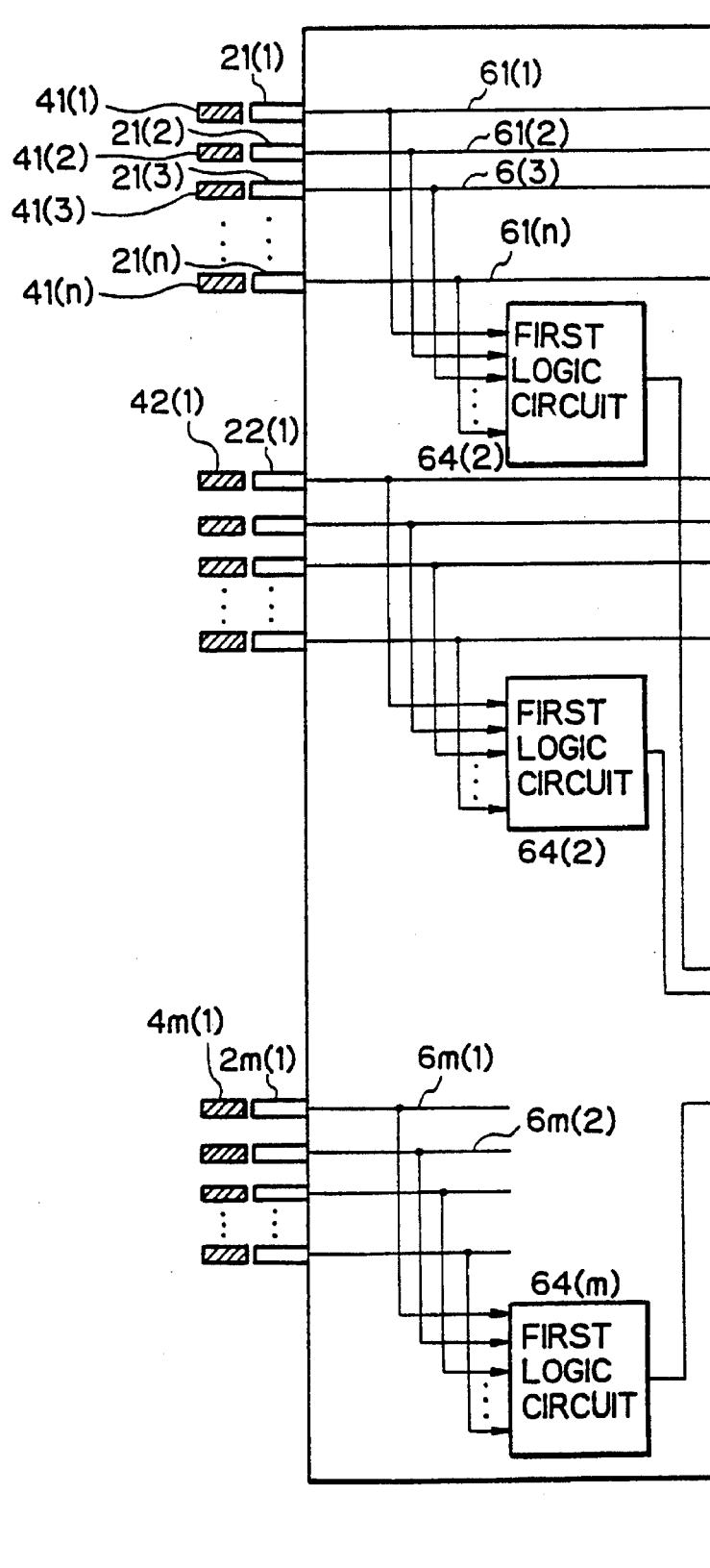
Figure 4B:
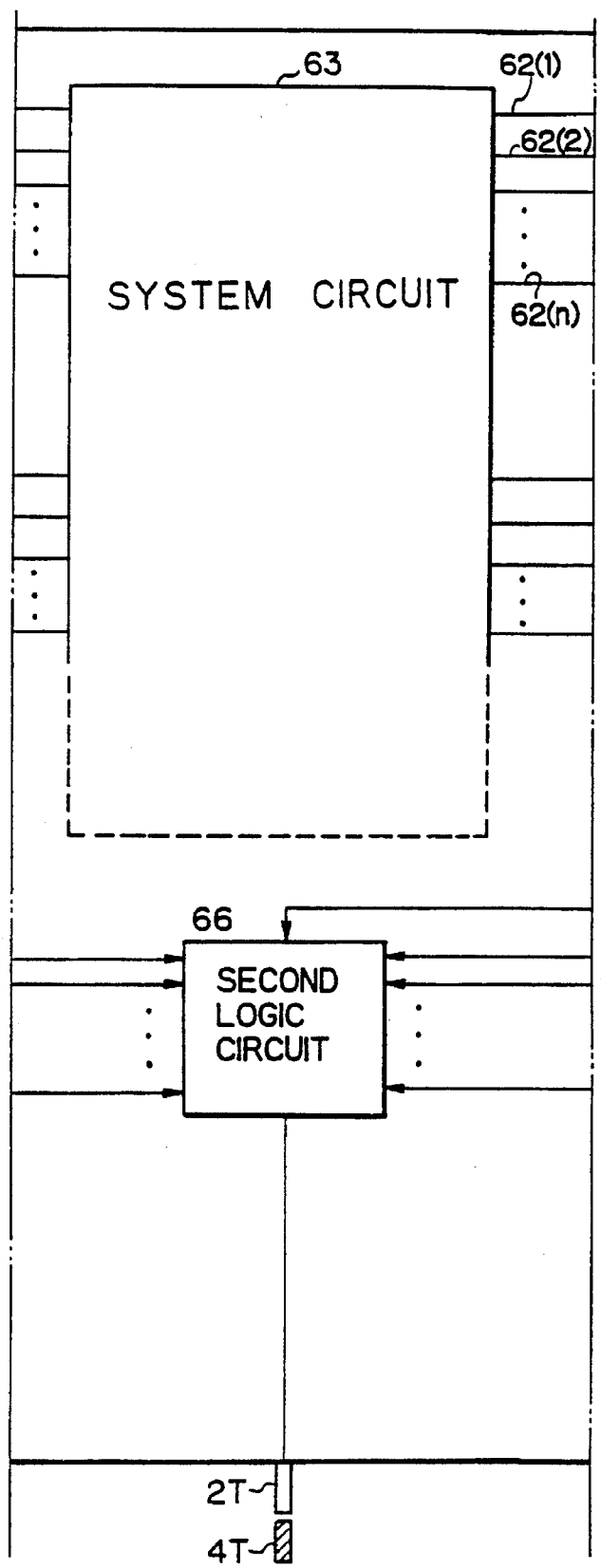
Figure 4C:
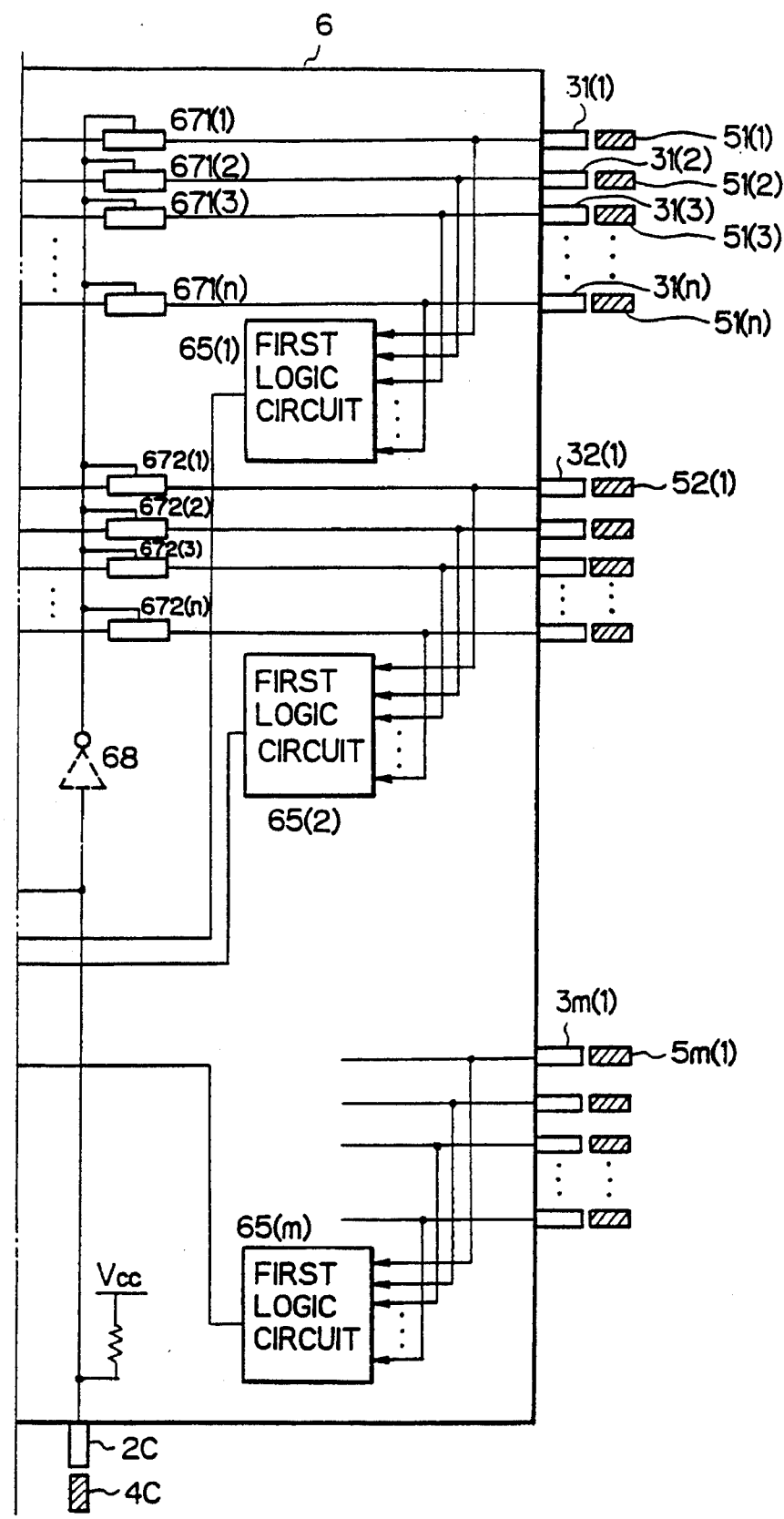

The structure of a semiconductor circuit element device with an arrangement for testing the device according to an embodiment of the present invention is shown in FIG. 4. Some parts of the structure shown in FIG. 4 are similar to those disclosed in the specification of Japanese Patent Application No. 3-126787 of Fujitsu Limited filed on Apr. 30, 1992.

The semiconductor circuit element device shown in FIG. 4 is constituted by a LSI 6 semiconductor circuit element device, external pins 21(1), 21(2), ... 21(n), 22(1), 22(2), ...; 31(1), 31(2), ... 31(n), 32(1), 32(2), ..., input side lines 61(1), 61(2), ..., output side lines 62(1), 62(2), ..., a system circuit 63, a plurality of first logic circuits 64(1), 64(2), ... 64(m); 65(1), 65(2), ... 65(m), a second logic circuit 66, a plurality of switch circuits 671(1), 671(2), ... 671(n), 672(1), 672(2), ..., a test control external pin 2C, and a test output external pin 2T.

Each of the external pins 21(1), 21(2), ..., 31(1), 31(2), ..., 2C, and 2T, which are lead conductors of the LSI, is to be connected by soldering to "foot prints" 41(1), 41(2), ..., 51(1), 51(2), ..., 4C, and 4T, or conductor connecting portions, on the printed circuit board. In the drawings, for the convenience of the illustration, the "foot prints" are illustrated as being separated from the corresponding external pins.

A plurality of first logic circuits 64(1), 64(2), ... 64(m); 65(1), 65(2), ... 65(m) are provided in correspondence with the groups of the input side lines 61(1), 61(2), ..., and to output side lines 62(1), 62(2), .... For example, in the first logic circuit 64(1), when all of the input signals thereto are active signals, the active output signal is output therefrom, while when one or more of the input signals thereto is an inactive signal, the inactive output signal is output therefrom.

The second logic circuit 66 is constituted by a logic circuit structure of a single stage or plural stages. The second logic circuit 66 receives the outputs of the first logic circuits 64(1), 64(2), ... 64(m); 65(1), 65(2), ... 65(m). The second logic circuit 66 operates so that the output signal therefrom when all of the input signals thereto are inactive signals is different from the output signal therefrom when one or more of the input signals thereto is an active signal. The output of the second logic circuit 66 is output through the test output external pin 2T for indicating the results of the test.

The switch circuits 671(1), 671(2) ... 671(n); 672(1), 672(2), ... 672(n); ... are inserted in the output side lines 62(1), 62(2), .... These switch circuits operate to interrupt the connection between the system circuit 63 and the predetermined first logic circuits in accordance with the test control signal supplied through the test control external pin 2C.

Thus test control signal is also supplied to the second logic circuit 66. The output operation of the second logic circuit 66 is achieved when the test control signal supplied to the second logic circuit indicates the interruption processing mode.

It is possible to insert an inverter 68 in the path of the test control signal.

Figure 5B:
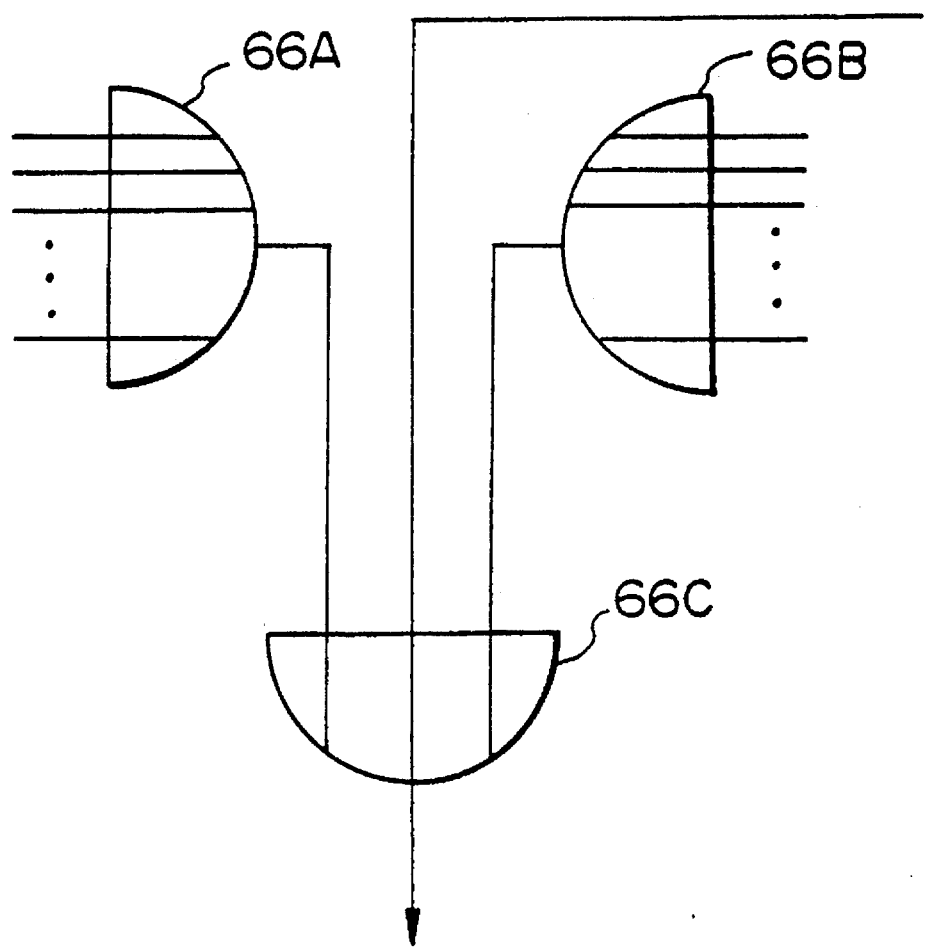

Each of the first logic gate circuits 64(1), 64(2), ... 64(m); 65(1), 65(2), ... 65(m) is, for example, an AND gate 64A shown in FIG. 5A. The second logic circuit 66 is, for example, a combination of the OR gates 66A, 66B, and 66C shown in FIG. 5B.

For example, the AND gate 64(1) is provided in correspondence with a group of input lines 61 formed by the grouping of the plurality of input lines 61. The AND gate 64(1) receives as inputs thereto a plurality of input lines belonging to the group in question. The output of the AND gate 64(1) is of the HIGH level, as an active state, when all of the input signals to the AND gate 64(1) are at the HIGH level, while the output of the AND gate 64(1) is at the LOW level, as an inactive state, when one or more of the input signals to the AND gate 64(1) is at the LOW level.

For example, the AND gate 65(1) is provided in correspondence with a group of output side lines 62(1), 62(2), . . . , formed by the grouping of output side lines 62(1), 62(2), . . . . The AND gate 65(1) receives as input signals thereto a plurality of output lines belonging to the group in question. The output of the AND gate 65(1) is at the HIGH level when all of the input signals to the AND gate 65(1) are at the HIGH level, while the output of the AND gate 65(1) is at the LOW level, when one or more of the input signals to the AND gate 65(1) is at the LOW level.

It is preferable that the number of lines belonging to one group be the same for all of the formed groups of lines.

With regard to the operations of the OR gates 66A, 66B, and 66C, as the constituents of the second logic circuit 66 (FIG. 5B, FIG. 4), the OR gate 66A receives the outputs of the AND gates 64(1)A, 64(2)A, . . . 64(m)A, as the first logic circuits 64(1), 64(2), . . . 64(m), and outputs a LOW level output signal when all of the inputs to the OR gate 66A are at the LOW level, while outputs a HIGH level output signal when one or more of the inputs to the OR gate 66A is at the HIGH level. The OR gate 66B receives the outputs of the AND gates 65(1)A, 65(2), . . . 65(m)A, as the first logic circuits 65(1), 65(2), . . . 65(m), and outputs a LOW level output signal when all of the inputs to the OR gate 66B are at the LOW level, while outputs a HIGH level output signal when one or more of the inputs to the OR gate 66B is at the HIGH level. The OR gate 66C receives the outputs of the OR gates 66A and 66B and the test control signal through the test control external pin 2C and outputs a LOW level output signal when all of the inputs to the OR gate 66C are at the LOW level, while outputs a HIGH level output signal when one or more of the inputs to the OR gate 66C is at the HIGH level. The output of the OR gate 66C is output as the output of the second logic circuit 66 through the test output external pin 2T.

Three state drivers 671(1), 671(2), . . . 671(n); 672(1), 672(2), . . . 672(n); . . . 67m(1), 67m(2), . . . 67m(n), used as the switching circuits, are inserted in the output side lines 62(1), 62(2), . . . . Each of the bidirectional drivers 671(1), 671(2), . . . places the corresponding output external pin in a high impedance state to cause the connection between the system circuit 63 and the first logic circuits 65(1), 65(2), . . . 65(m) to be interrupted. By this interruption processing, the undesirable occurrence of stresses upon the back driving in the in-circuit test is prevented. An inverter 68 may be inserted in the path of the test control signal if the interruptions by the bidirectional drivers are to be carried out in response to the supply of a LOW level signal to the test control external pin 2C.

Figure 6A:
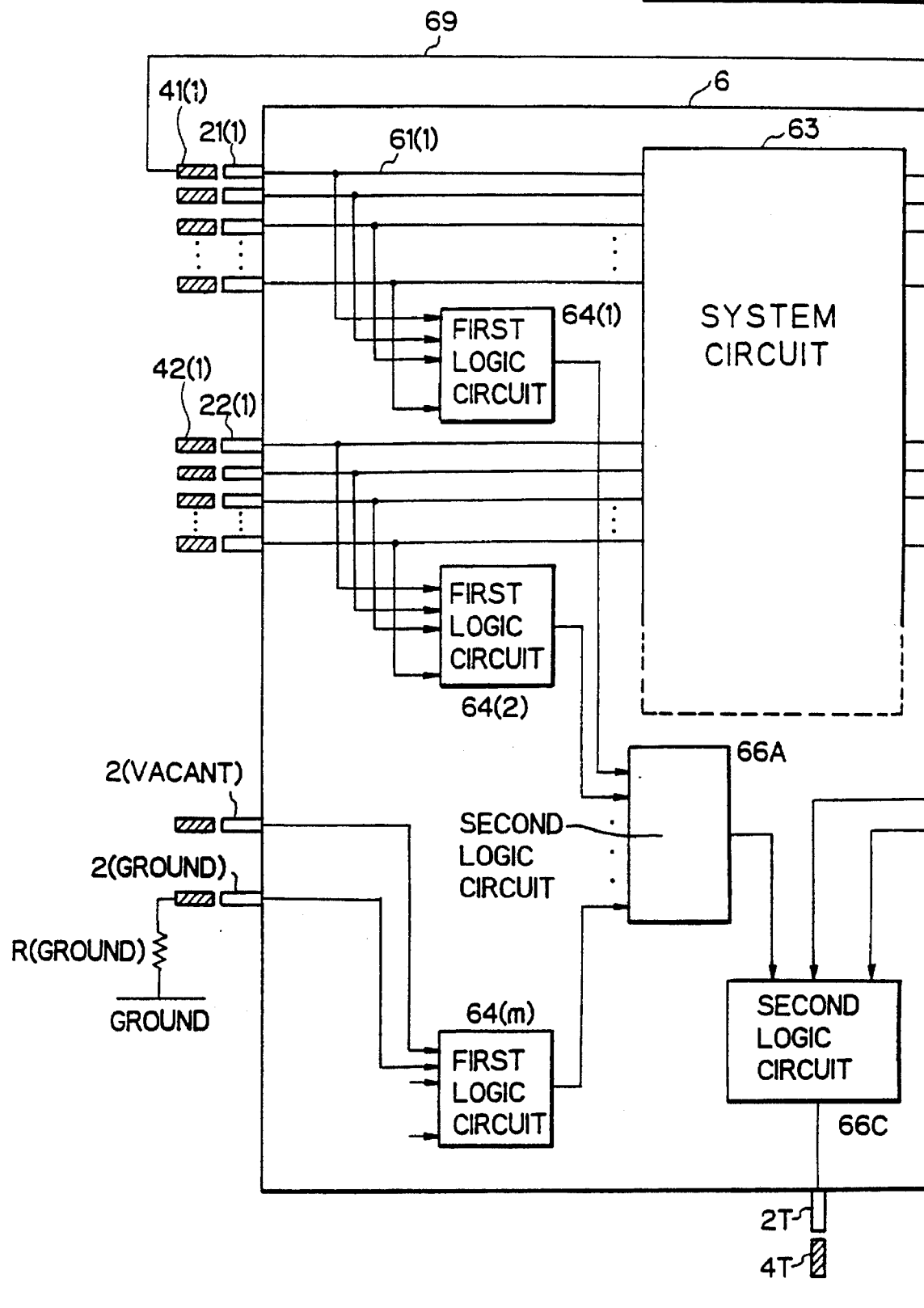
Figure 6B:
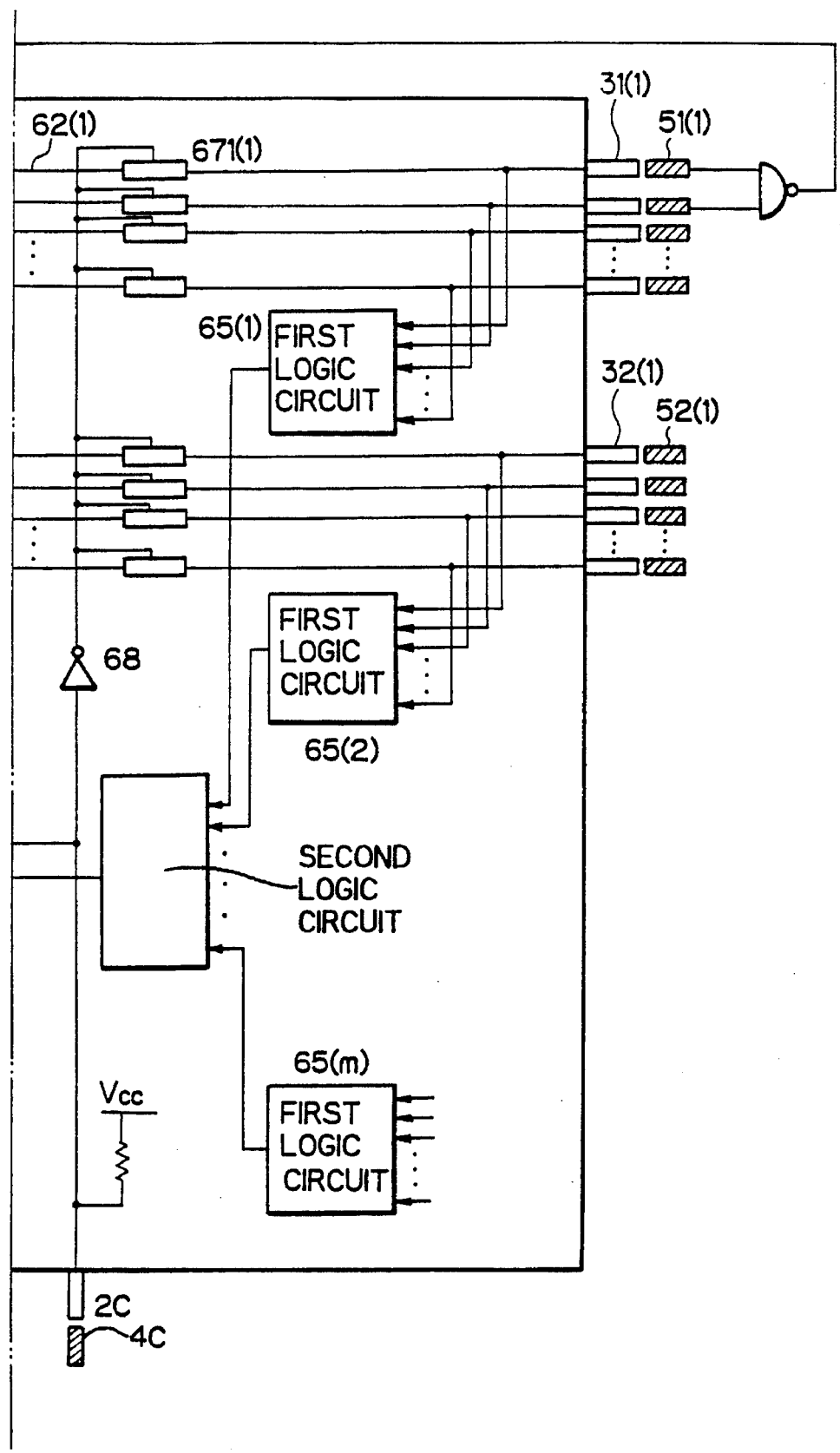

A modification of the semiconductor circuit element device according to an embodiment of the present invention is shown in FIG. 6. It is preferable that test pads corresponding to the vacant external pins 2(VACANT) be provided on the printed circuit board. It is necessary to provide a resister R(GROUND) corresponding to the grounding external pins 2(GROUND). It is possible to provide a self loop 69 connecting the output side external pin with the input side external pin.

The test of a semiconductor circuit element device with an arrangement for testing the device according to an embodiment of the present invention will be described with reference to FIGS. 7, 8, 9, and 10.

Figure 7A:
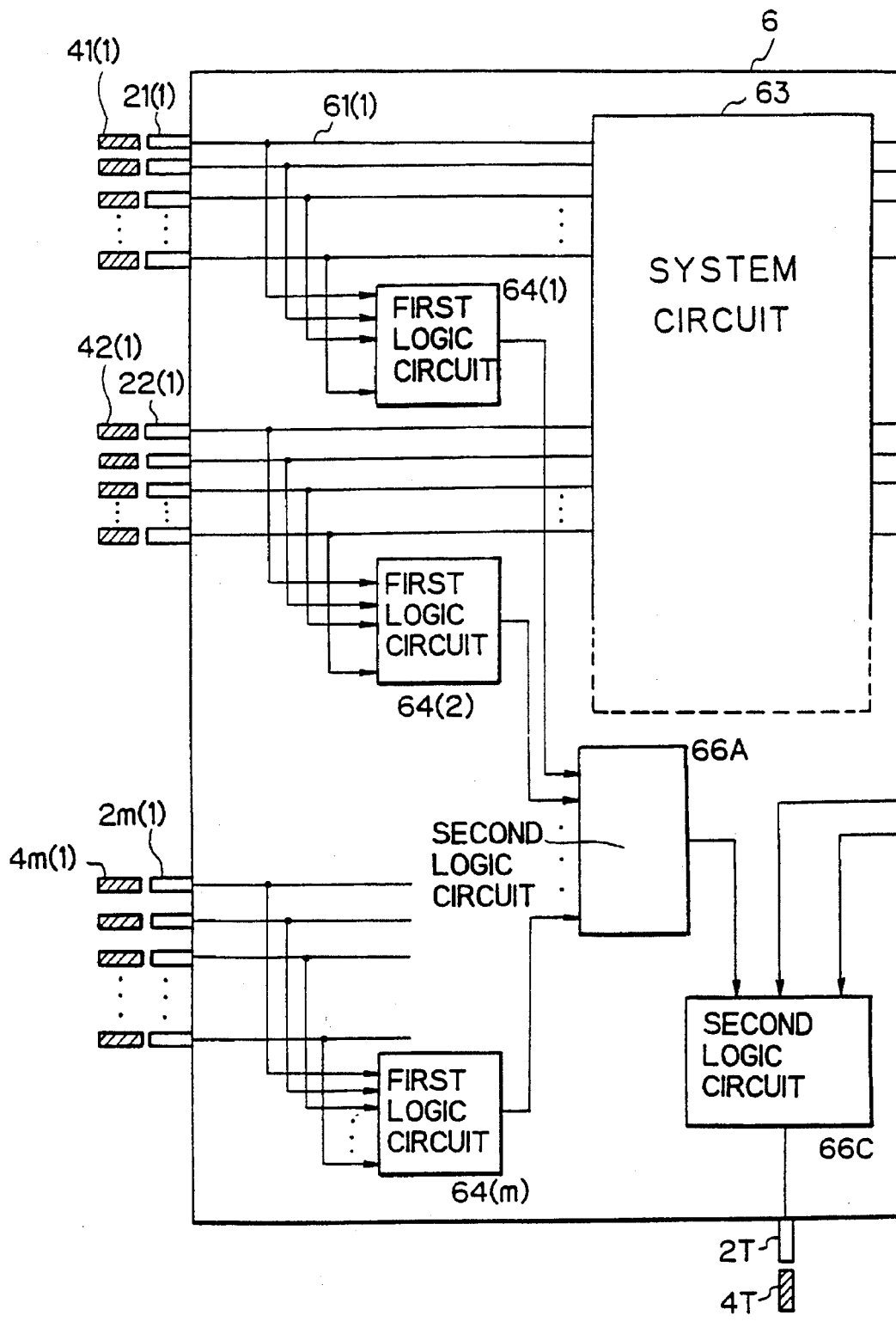
Figure 7B:
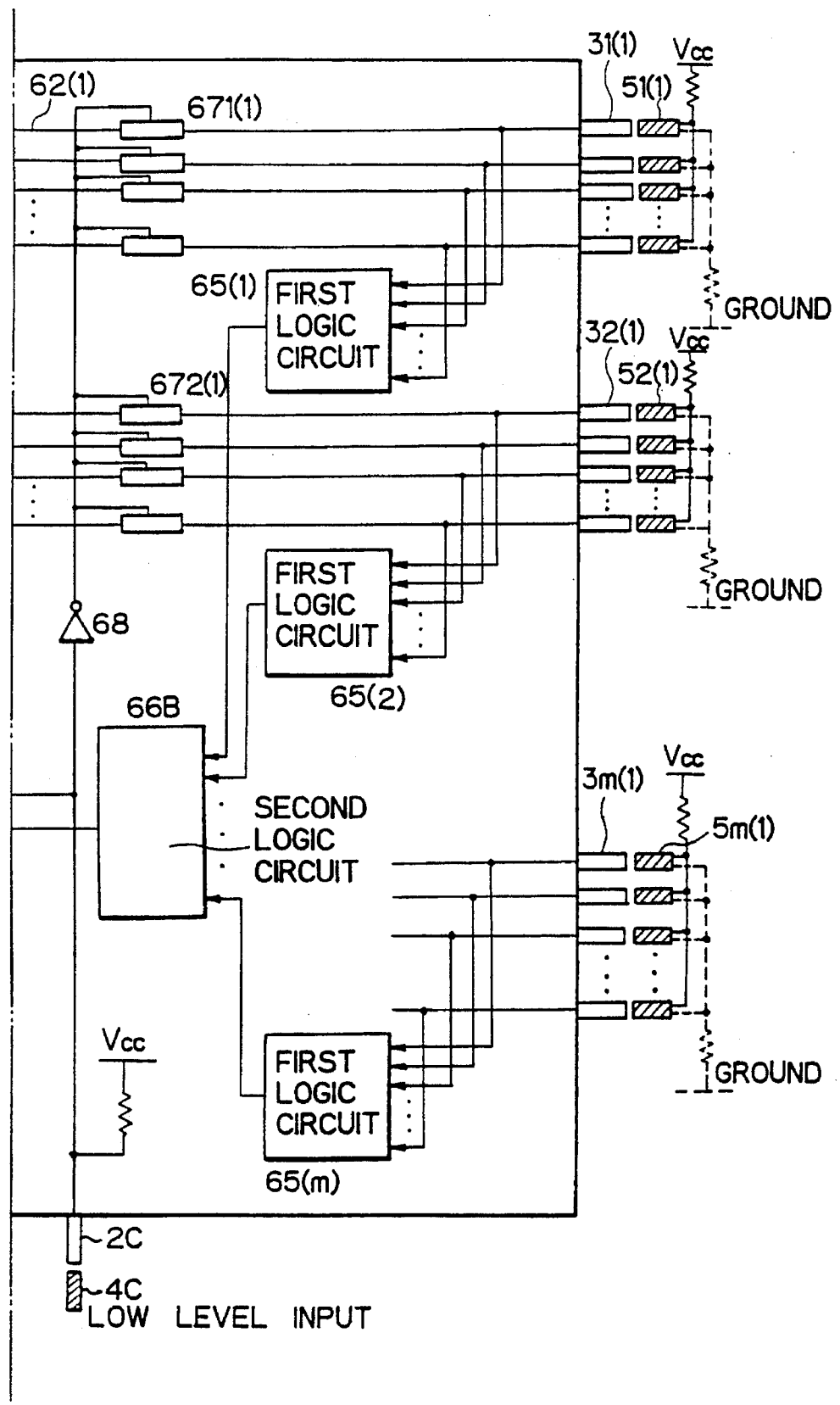

The first stage of the test process is explained with reference to FIG. 7. A LOW level signal is supplied to the test control external pin 2C. A pull-up resistor and a pull-down resistor are connected alternately to all of the output side external pins 31, 32, . . . 3m. Whether or not the potential of the output side external pin is at the HIGH level when the pull-up resistor, for realizing the power source potential is connected to the output side external pin is checked, as is the potential of the output side external pin is at the LOW level when the pull-down resistor for realizing the ground potential is connected to the output side external pin.

If the result of the check is affirmative, it is decided that the state of the connection between the test control external pin 2C and the corresponding "foot print" conductor connecting portion is normal.

Figure 8A:
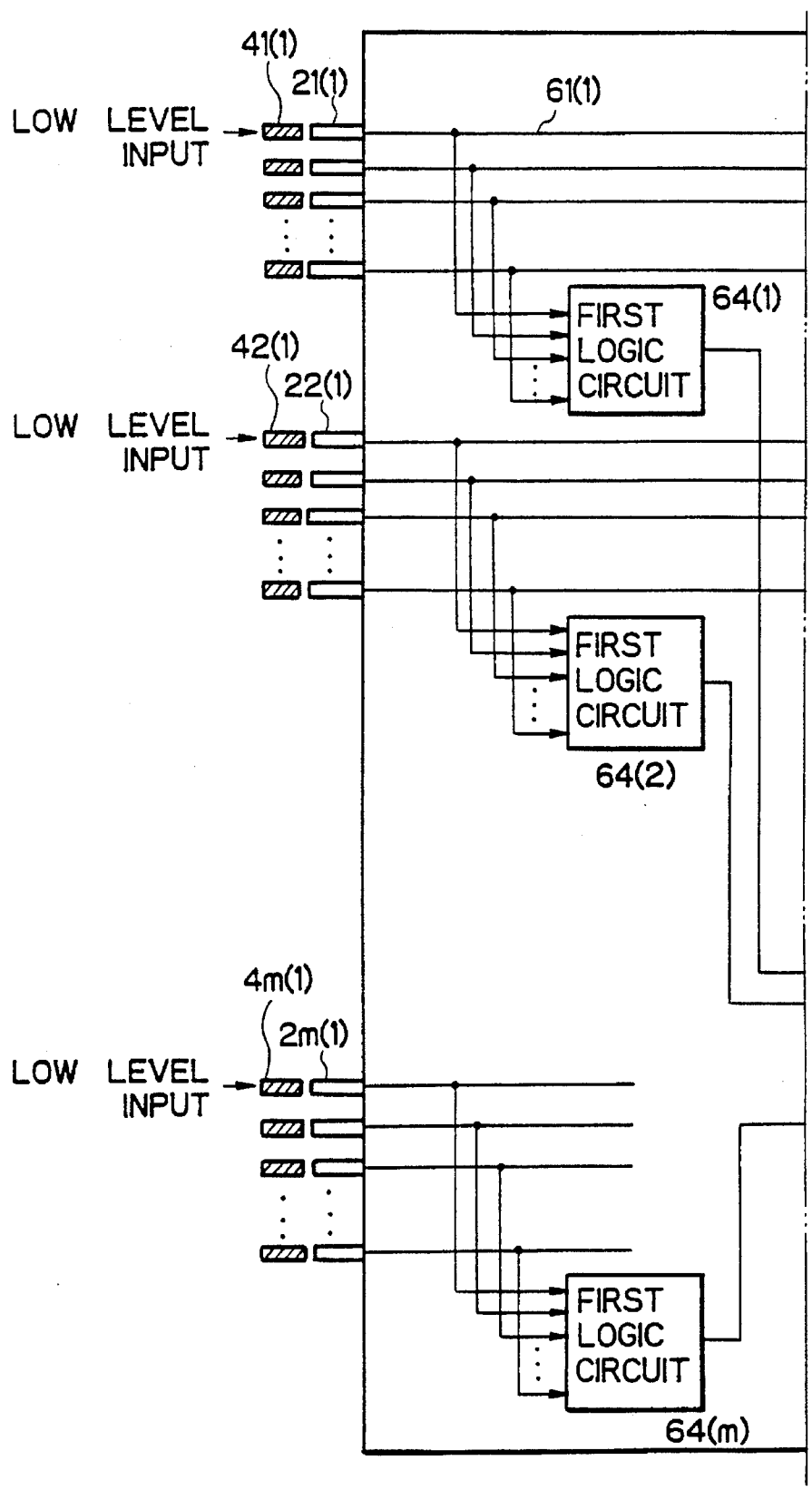
FIGS. 8A–8C illustrate the test of the connections between the control pin, test output pin, and the conductor connecting portions.
Figure 8B:
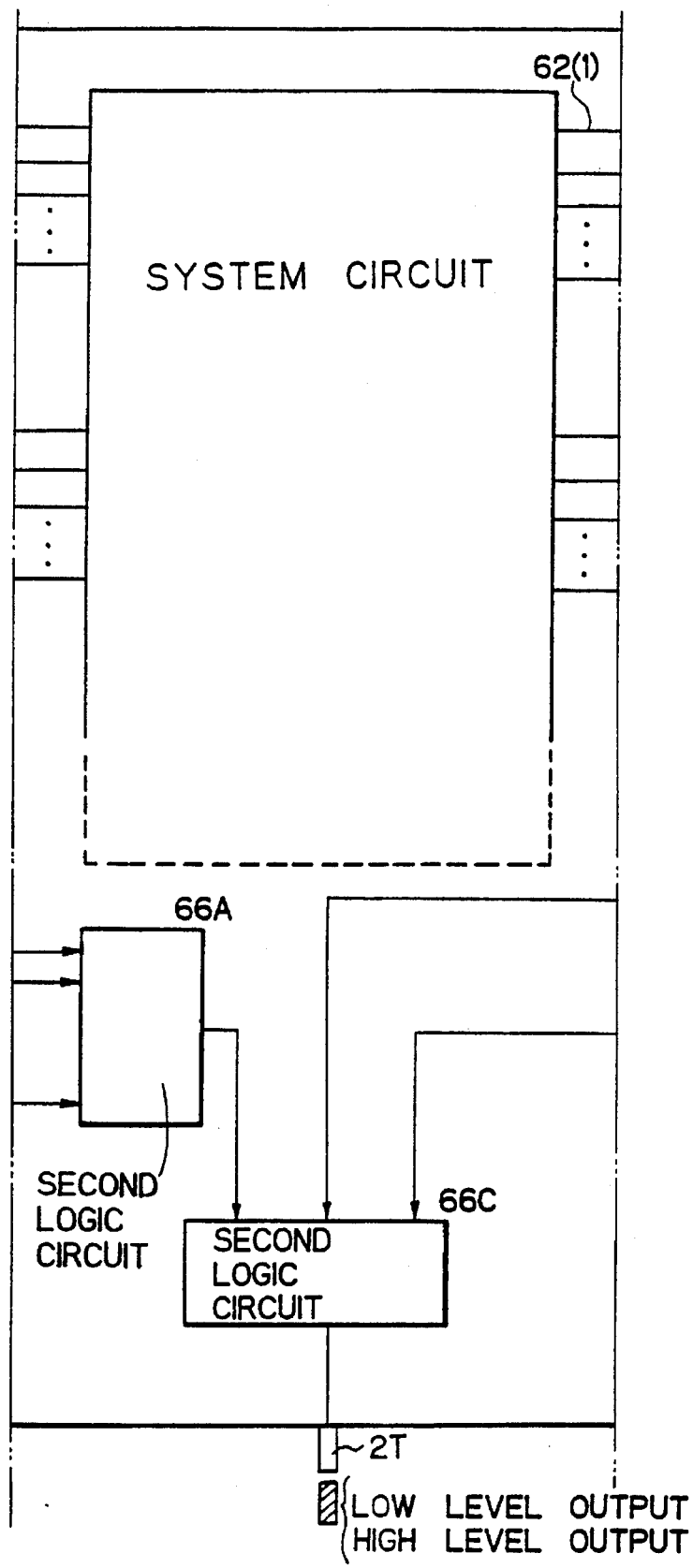
Figure 8C:
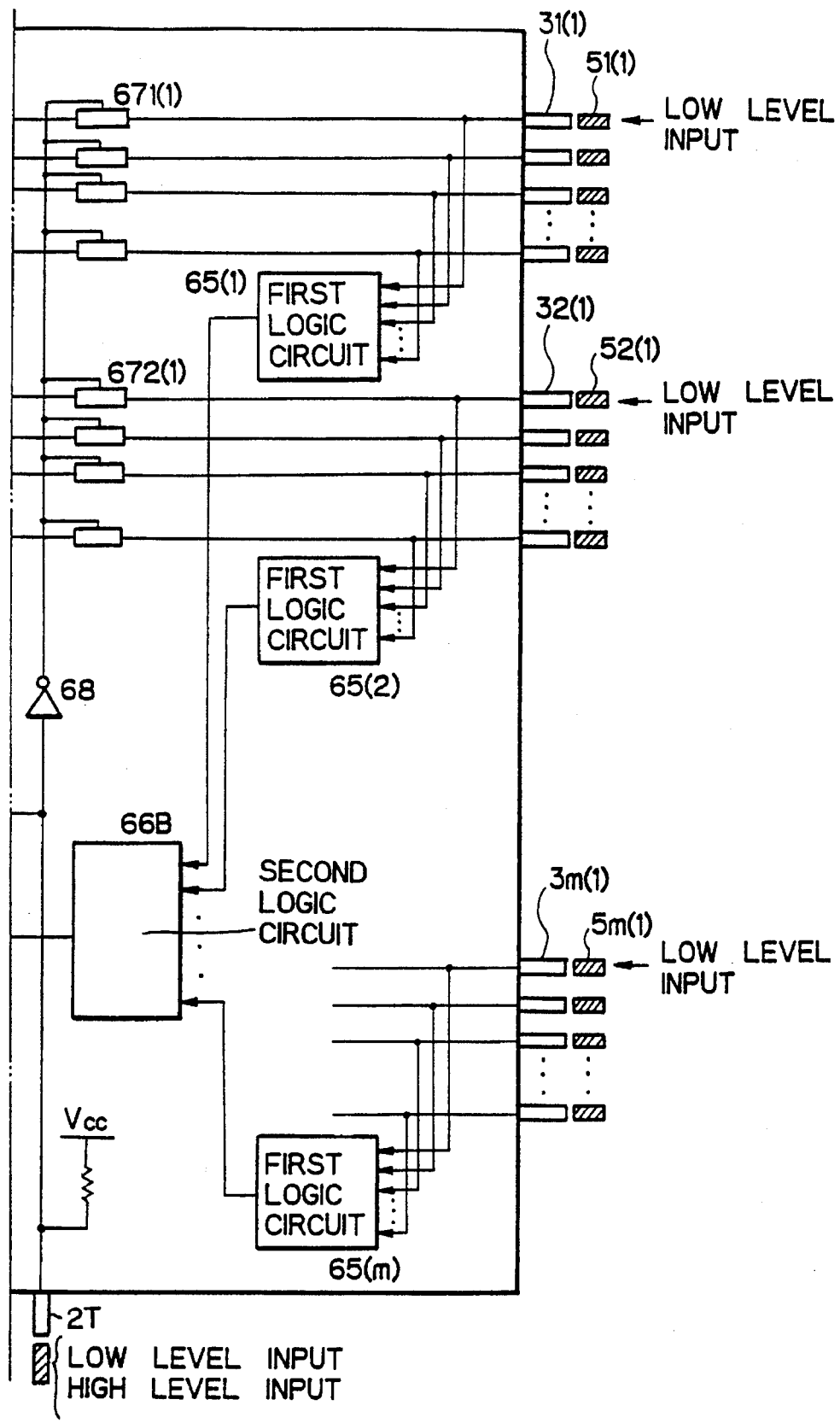

The second stage of the test process is explained with reference to FIG. 8. LOW level signals are supplied to the input side external pins 21(1), 22(1), . . . 2m(1), and the output side external pins 31(1), 32(1), . . . 3m(1). First, a LOW level signal is supplied to the test control external pin 2C, and the output of a LOW level signal from the test output external pin 2T is checked. After that, a HIGH level signal is supplied to the test control external pin 2C, and the output of a HIGH level signal from the test output external pin 2T is checked.

By checking the above-mentioned outputs of LOW and HIGH level signals from the test output external pin 2T, the state of connections of the test control external pin and the test output external pin with the corresponding "foot print" conductor connecting portions is tested.

Figure 9B:
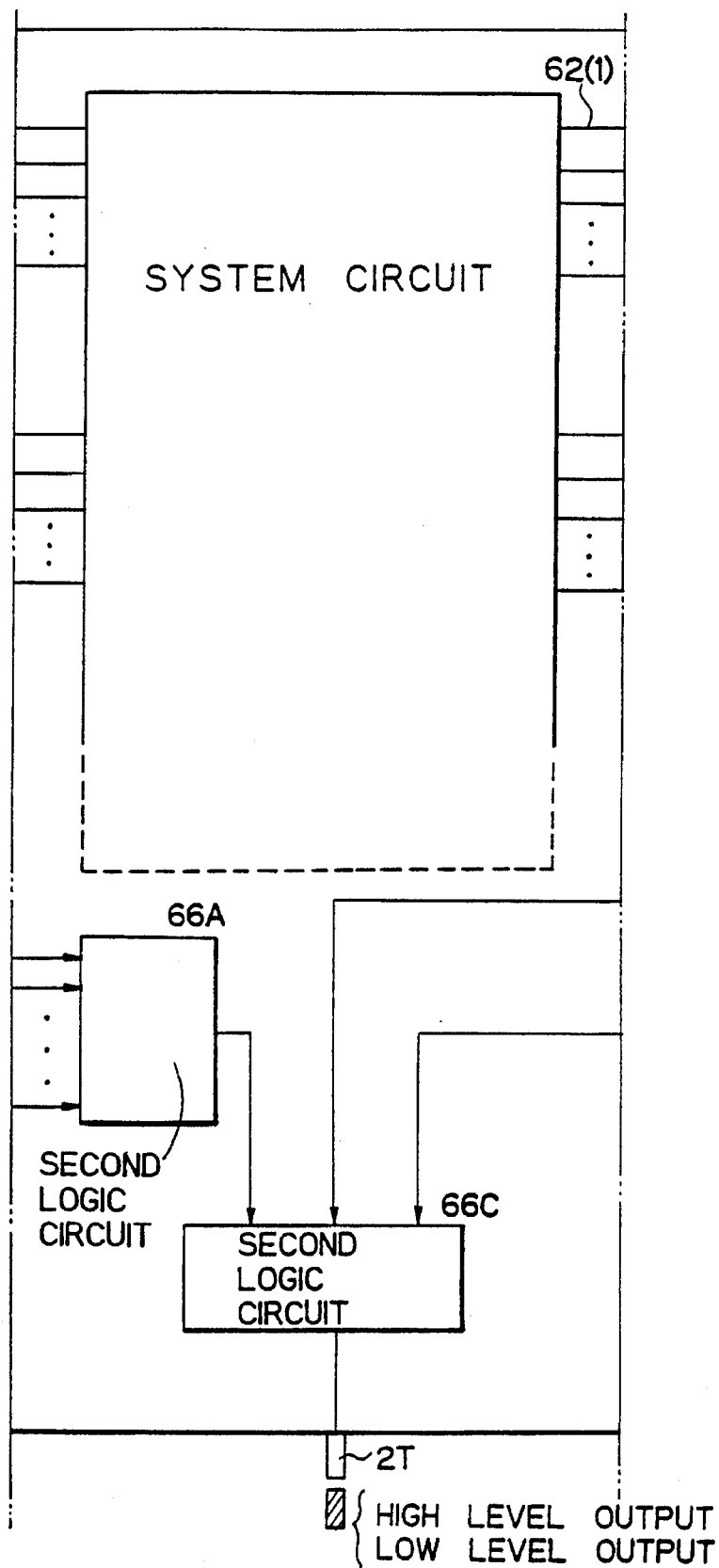
Figure 9C:
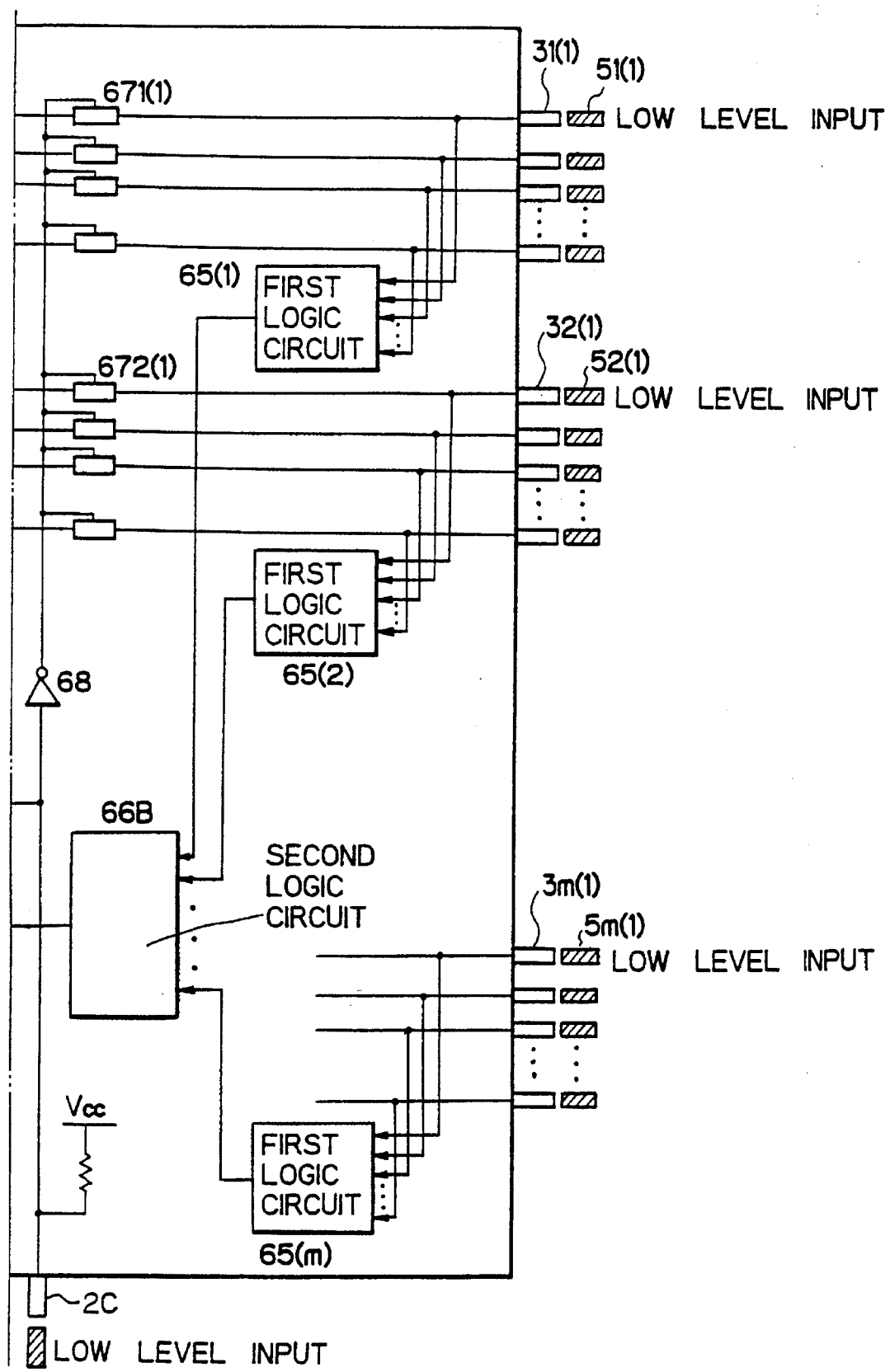

The third stage of the test process is explained with reference to FIG. 9. A LOW level signal is fixedly supplied to the test control external pin 2C. A LOW level signal is fixedly supplied to input side external pins 22(1), . . . , 2m(1), . . . , and output side external pins 31(1), . . . , 32(1), . . . , 3m(1), . . . . First, HIGH level signals are supplied to all of the input side external pins 21(1), 21(2), . . . 21(n) of the group in question to be tested, and the output of a HIGH level signal from the test output external pin 2T is checked.

After that, the HIGH level signal supplied to the input side external pin 21(1) is changed to a LOW level signal, and the output of a LOW level signal from the test output external pin 2T is checked.

By checking the above-mentioned outputs of HIGH and LOW level signals from the test output external pin 2T, the state of connection of an input side external pin 21(1) with the corresponding "foot print" conductor connecting portion is tested.

After the test of the input side external pin 21(1), the input side external pins 21(2), 21(3), . . . 21(n) are tested successively in a similar manner. The tests are repeated for the input side external pins 22(1), . . . , 2m(1), . . . in a similar manner.

Figure 10B:
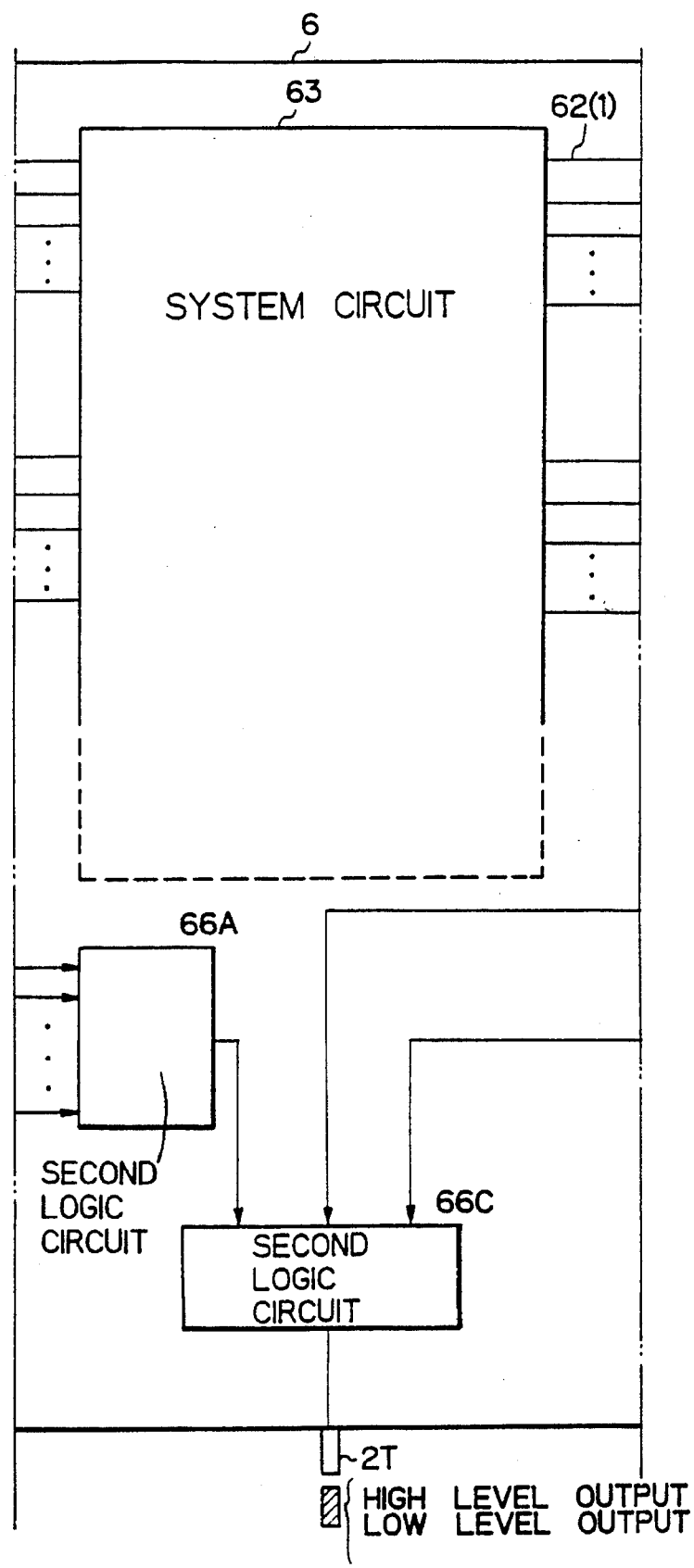
Figure 10C:
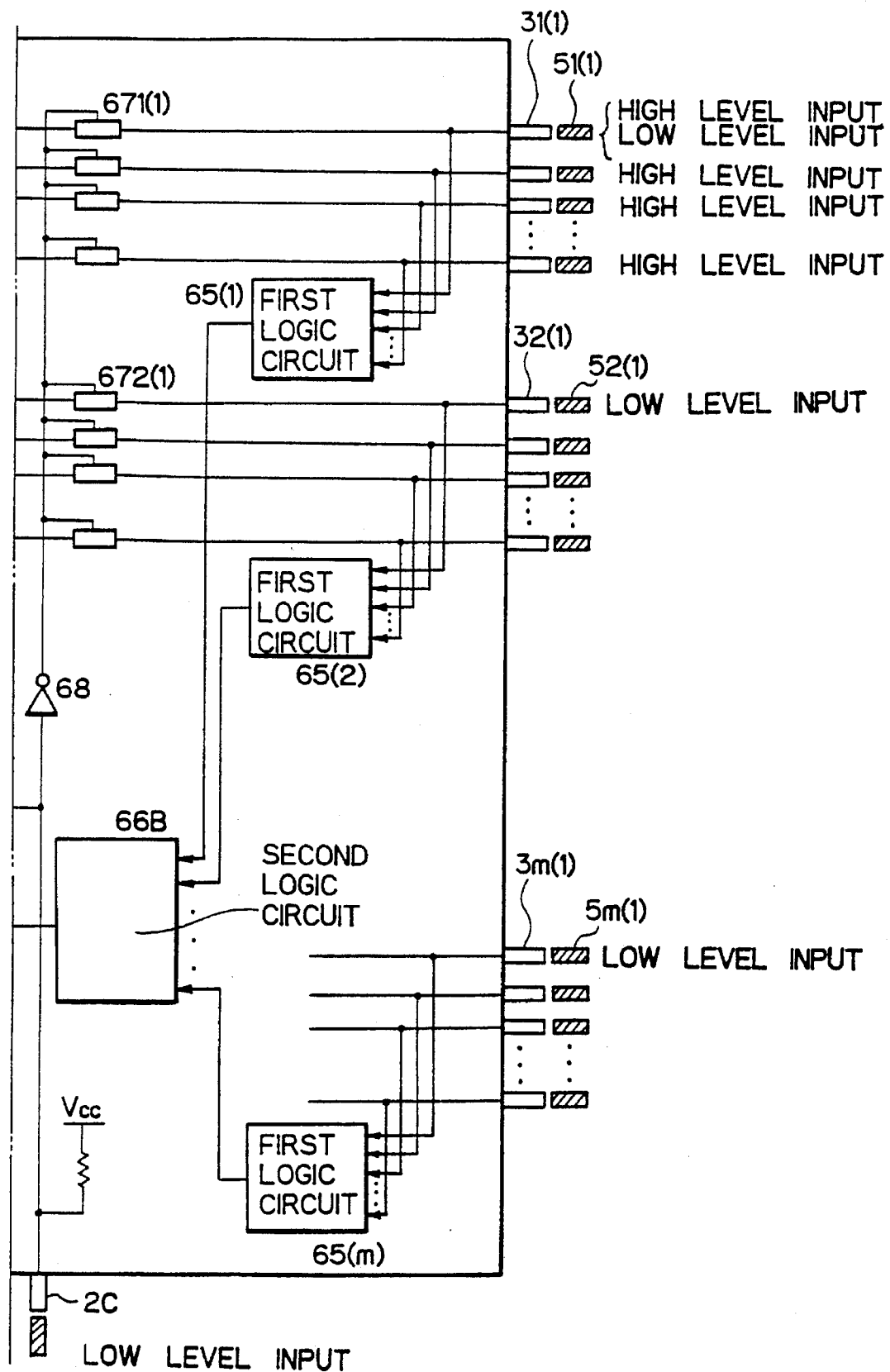

The fourth stage of the test process is explained with reference to FIG. 10. A LOW level signal is fixedly supplied to the test control external pin 2C. A LOW level signal is fixedly supplied to input side external pins 21(1), . . . , 22(1), . . . , 2m(1), . . . , and output side external pins 32(1), . . . , 3m(1), . . . . First, HIGH level signals are supplied to all of the output side external pins 31(1), 31(2), . . . 31(n) of the group in question to be tested, and the output of a HIGH level signal from the test output external pin 2T is checked.

After that, the HIGH level signal supplied to the output side external pin 31(1) is changed to a LOW level signal, and the output of a LOW level signal from the test output external pin 2T is checked.

By checking the above-mentioned outputs of HIGH and LOW level signals from the test output external pin 2T, the state of connection of an output side external pin 31(1) with the corresponding "foot print" conductor connecting portion is tested.

After the test of the output side external pin 31(1), the output side external pins 31(2), 31(3), . . . 31(n) are tested successively in a similar manner. The tests are repeated for output side external pins 32(1), . . . , 3m(1), . . . in a similar manner.

The test of the semiconductor circuit element device in connection with the semiconductor test operation unit will be explained with reference to FIG. 11. A test operation unit 7 is provided in correspondence with a semiconductor circuit element 6 to be tested. A plurality of exclusively used tester pins 711, 712, . . . 71m; 721, 722, . . . 72m and a plurality of commonly used tester pins 732, 733, . . . 73n are provided in the test operation unit 7. Each of the exclusively used tester pins and the commonly used tester pins is connected to a driver D and a comparator C.

The connection for the unit under test (UUT) is made by contacting a tester pin of the test operation unit 7 through a fixture to a probe point provided on the printed circuit board on which the semiconductor circuit element device 6 is arranged.

Figure 11B:
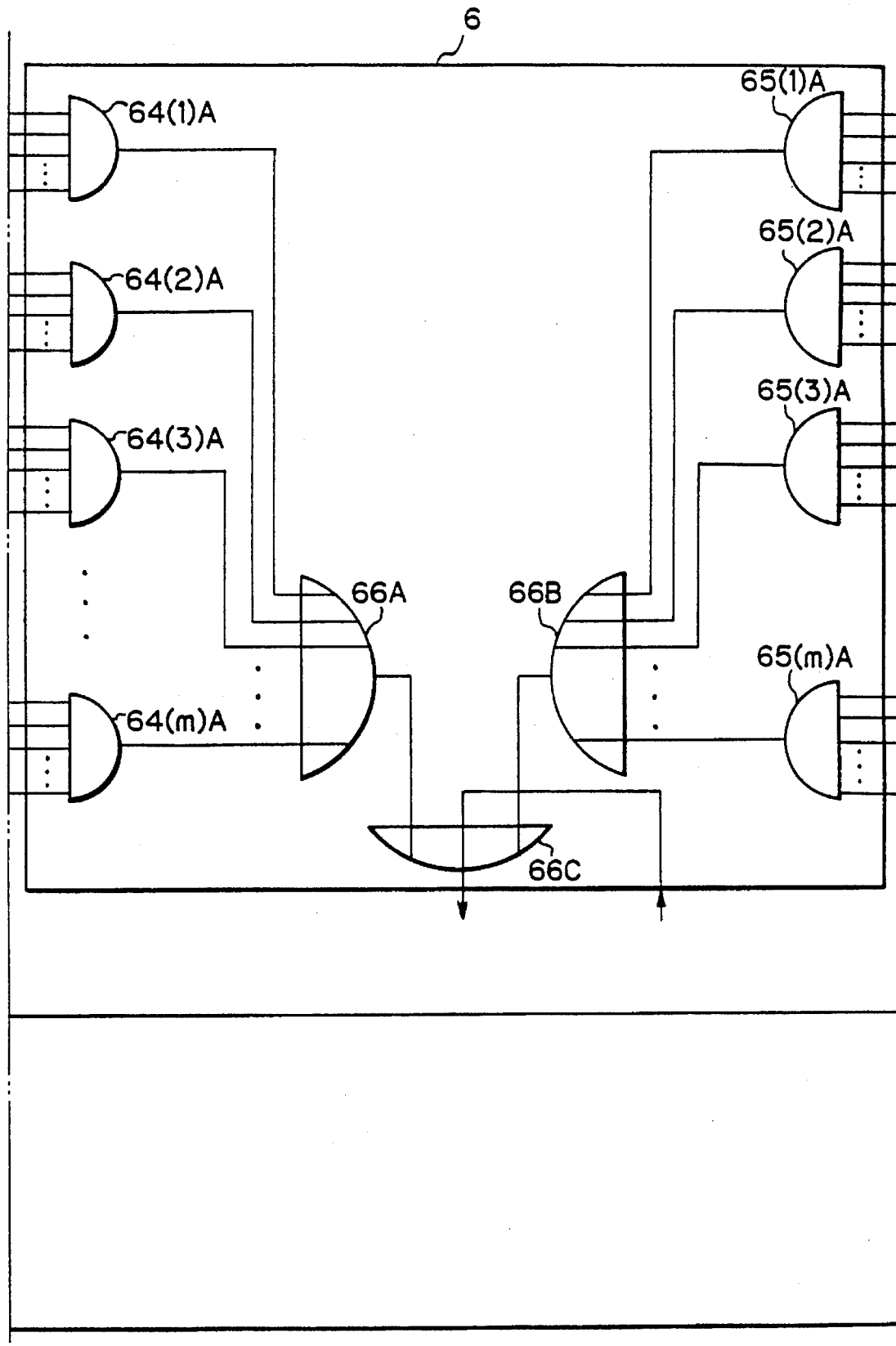
Figure 11C:
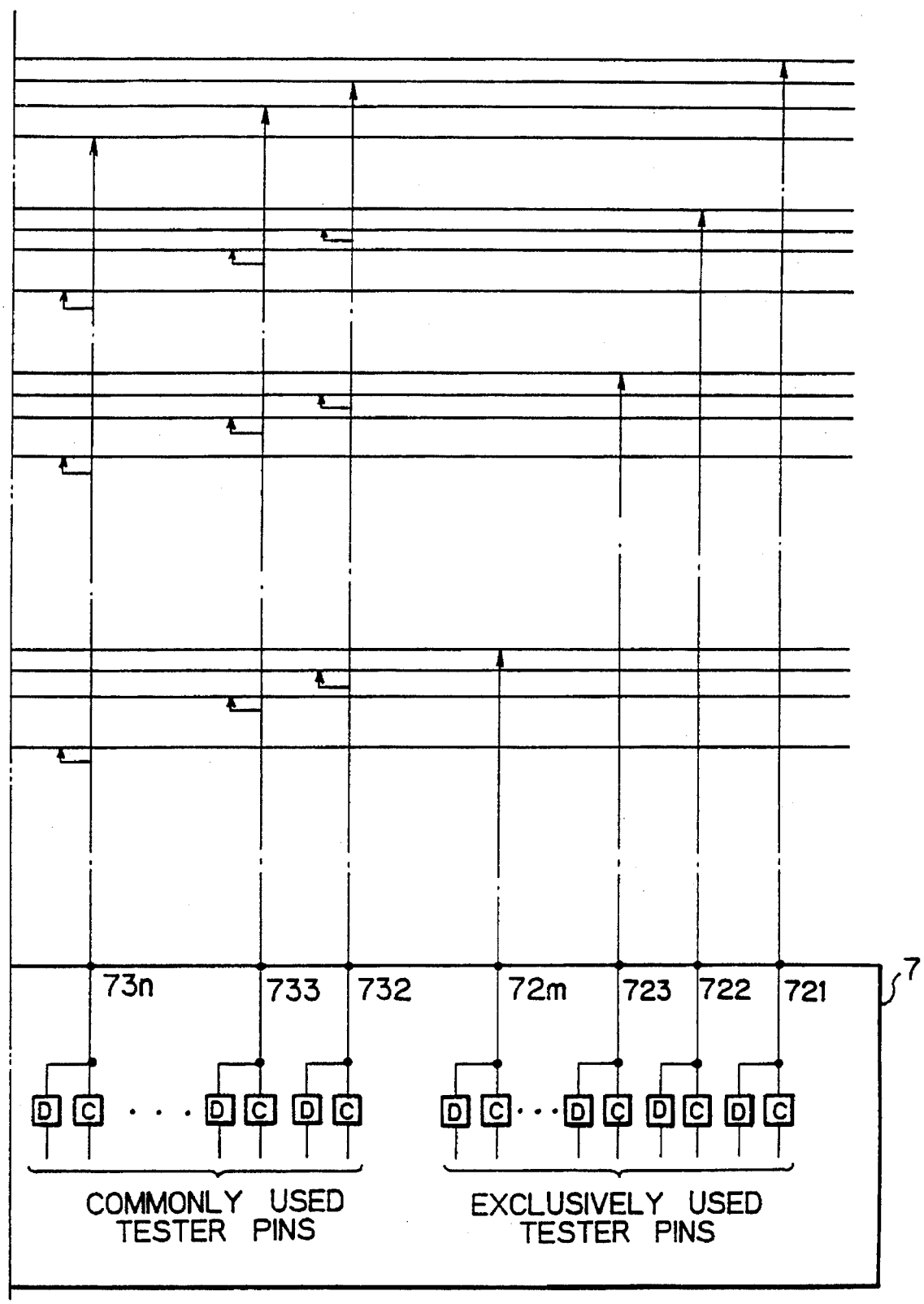

In the arrangement of FIG. 11, it is possible to test the states of connections between the input and output side external pins in the semiconductor circuit element device 6 and the "foot prints" on the printed circuit board, even if the number of the input and output side external pins is more than the number of the tester pins of the test operation unit 7. Where there are 10 lines in one group and 40 groups, 40 exclusively used tester pin are required for the test operation unit 7, nine commonly used tester pins, one test control external pin, and one test output external pin, or 40+9+1+1=51 pins in total. In the prior art, 402 tester pins were required for the test operation unit, i.e., 40×10+1+1=402.

An assembly of semiconductor circuit elements for using an assignment software on the market will be explained with reference to FIG. 12. The assignment software is used for assigning the tester pins of the test operation unit. As shown in FIG. 12, a semiconductor circuit element is regarded as an assembly of a plurality of semiconductor circuit element members 11, 12, . . . 1m, 21, 22, . . . 2m. By giving the information of the assembly of the semiconductor circuit element members to the assignment software, the assignment of the tester pins is achieved.

An example of the process of a test of a semiconductor circuit element device according to an embodiment of the present invention will be explained with reference to FIG. 13.

In the case of testing the state of connection between the test control external pin and the "foot print" or conductor on the circuit board, corresponding thereto, a test control signal is fixedly supplied to the "foot print" corresponding to the test control external pin. By this supply the connection between the system circuit and the output side first logic circuits is interrupted by the switch circuits. After that, a test pattern is supplied through the "foot prints" to the output side external pins. By checking the levels of the potentials of the output side external pins in accordance with the supply of the detection signals, the connection between the test control external pin and the "foot print" corresponding thereto is tested.

In the case of testing the states of connections between the test control external pin and the "foot print", corresponding thereto, and the connection between the test output external pin and the "foot print" corresponding thereto, inactive signals are supplied to at least one line of the lines belonging to a predetermined group of the groups of lines, and control signals for realizing the interruption processing and the non-interruption processing of the switch circuits are alternately supplied to the "foot print" corresponding to the test control external pin.

All of the first logic circuits receive the supplied inactive signals and output inactive output signals. The second logic circuit receives the inactive signals from the first logic circuits.

When a control signal for realizing the interruption processing of the switch circuits is supplied, the operation state is such that the output signal in the case where all of the first logic circuits output inactive output signal is different from the output signal in the case where one or more of the first logic circuits outputs an active output signal, and an inactive signal is output through the test output external pin.

When a control signal for realizing the non-interruption processing of the switch circuits is supplied, the operation state is other than that described above, and an active signal is output through the test output external pin. Then, the test operation unit checks the alternate outputs of the active signal and the inactive signal. Based on this check, the states of connection between the test control external pin and the "foot print" corresponding thereto and the connection between the test output external pin and the "foot print" corresponding thereto are detected.

After that, first through fourth processes are carried out by the test operation unit.

In the first process, a group is selected as a group to be tested from the groups of lines in the semiconductor circuit element.

In the second process, inactive signals are fixedly supplied through "foot prints" to one or more of the lines of the groups other than the above-mentioned selected group. By this supply of the inactive signals, the first logic circuits corresponding to the non-selected groups output inactive signals, and the second logic circuit outputs an inactive signal when the first logic circuits output inactive signals, and an active signal when the first logic circuits output active signals.

In the third process, active signals are supplied through "foot prints" to the lines of the group to be tested selected in the above-mentioned first process. By this supply, the first logic circuits corresponding to the group to be tested output active signals. Receiving the active signals output from the first logic circuits, the second logic circuit outputs through the test output external pin an active signal. The test operation unit checks whether or not an active signal is output through the test output external pin.

In the fourth process, lines of the group to be tested selected in the above-mentioned first process are successively selected, inactive signals are supplied successively through "foot prints" to the selected lines, and active signals are supplied through "foot prints" to the remaining lines. Receiving these active and inactive signals, the first logic circuits output inactive signals. Receiving the inactive signals from the logic circuits, the second logic circuit outputs through the test output external pin an inactive signal. The test operation unit checks whether or not an inactive signal is output through the test output external pin.

If an active signal is output through the test output external pin in the above-mentioned third process and an inactive signal is output through the test output external pin in the above-mentioned fourth process, then the state of the connection between the external pin connected to the line to be tested and the "foot print" corresponding thereto is normal.

Structures and operations of semiconductor circuit element devices with arrangements for testing the devices according to alternative embodiments of the present invention are illustrated in FIGS. 14 to 21.

Figure 14:
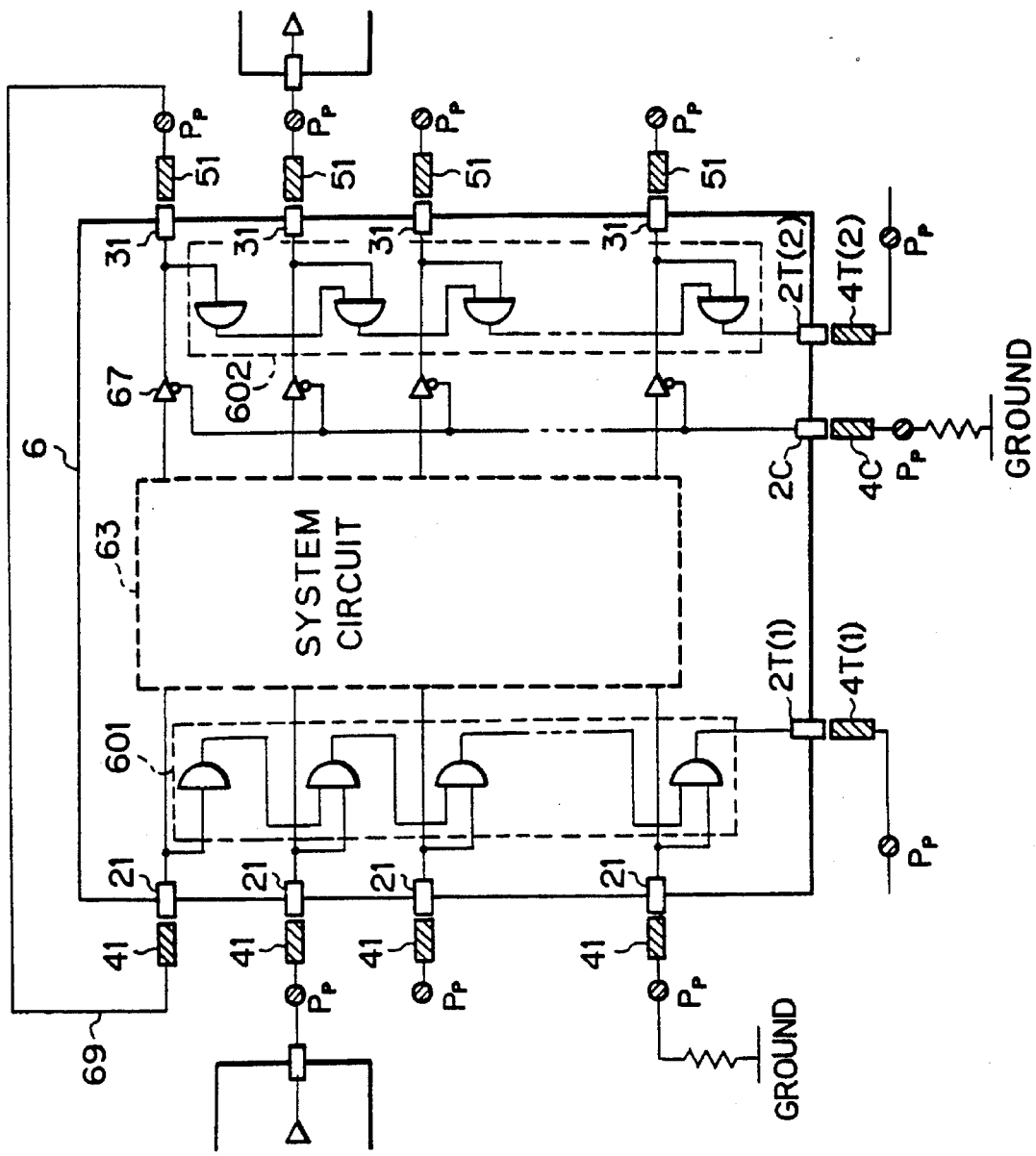
FIGS. 14 to 21 illustrate the structures and the operations of semiconductor circuit element devices with arrangements for testing the devices according to alternative embodiments of the present invention.

The device shown in FIG. 14 is constituted by an integrated circuit 6, input side external pins 21, a system circuit 63, a switch circuit 67, output side external pins 31, a test control external pin 2C, a test output external pin 2T, an input side connection quality determination portion 601, an output side connection quality determination portion 602, a self loop 69, and probe points $P_p$ and "foot prints" 41, 51 on a printed circuit board.

AND gates 601 provided in correspondence with the input side external pins are connected serially in a chain form. These connected AND gates constitute the input side connection quality determination portion 601. Other AND gates provided in correspondence with the output side external pins are connected serially in a chain form and constitute the output side connection quality determination portion 602.

Figure 15:
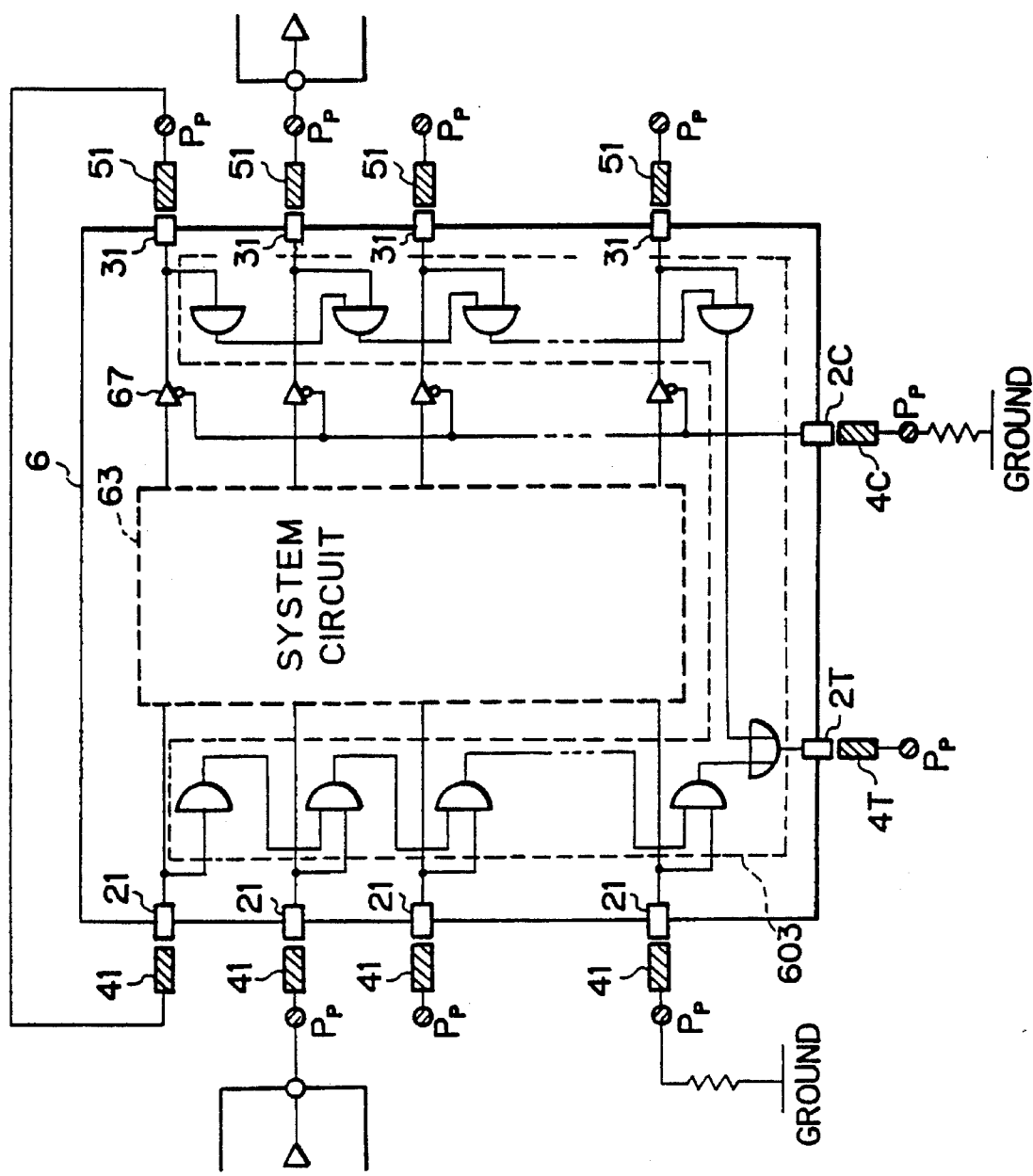

The device shown in FIG. 15 is similar to that shown in FIG. 14, except that a single connection quality determination portion 603 including an OR gate combining the input side and the output side is provided.

Figure 16:
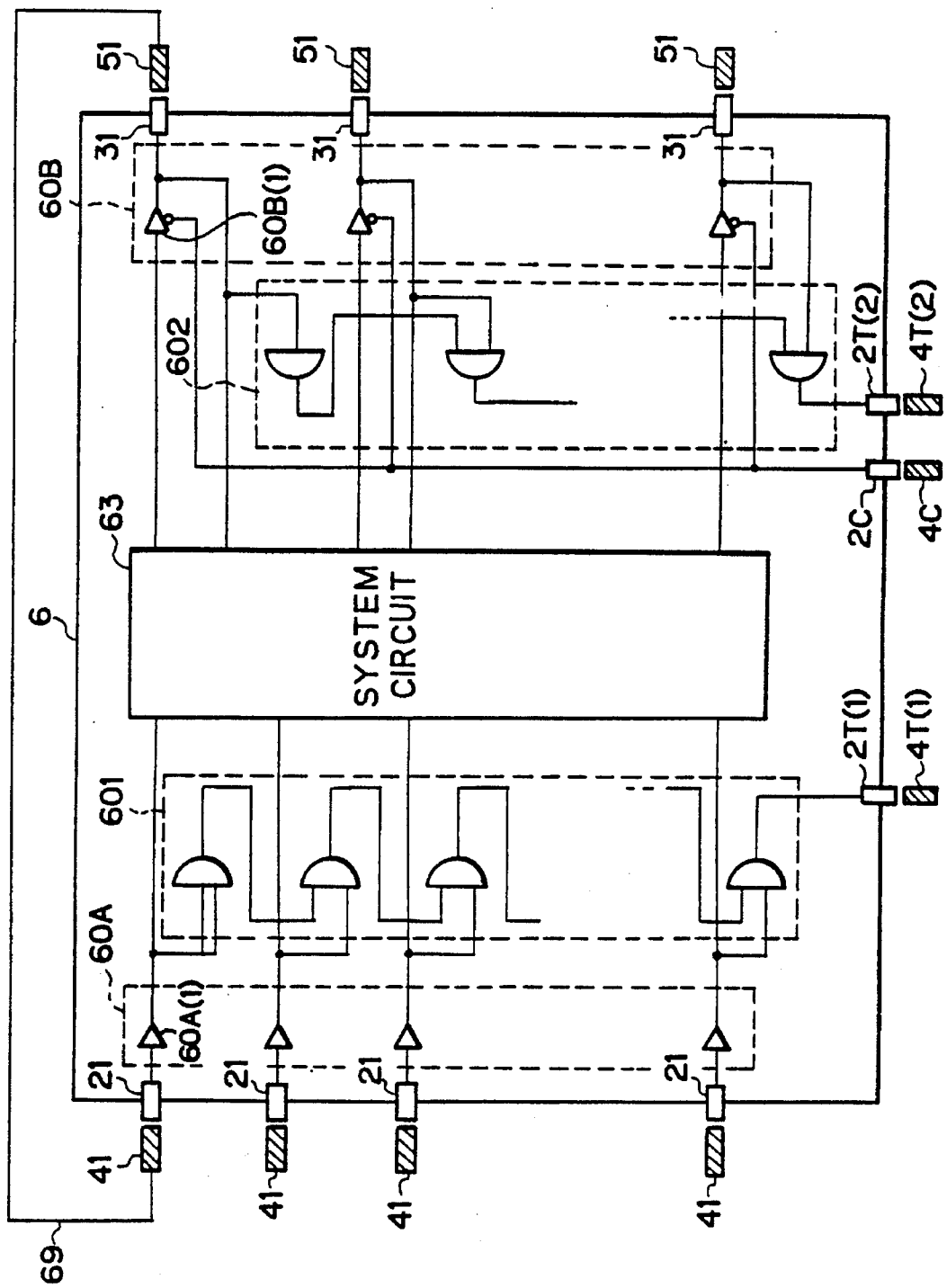

The structure of the device in the case where the structure shown in FIG. 14 is applied to a CMOS is shown in FIG. 16. In the structure shown in FIG. 16, there are provided an input macro 60A having input buffers 60A(1), an output macro 60B having output buffers 60B(1), an input side connection quality determination portion 601, and an output side connection quality determination portion 602.

The operation of the device shown in FIG. 14 will be explained with reference to FIG. 17.

Figure 17:
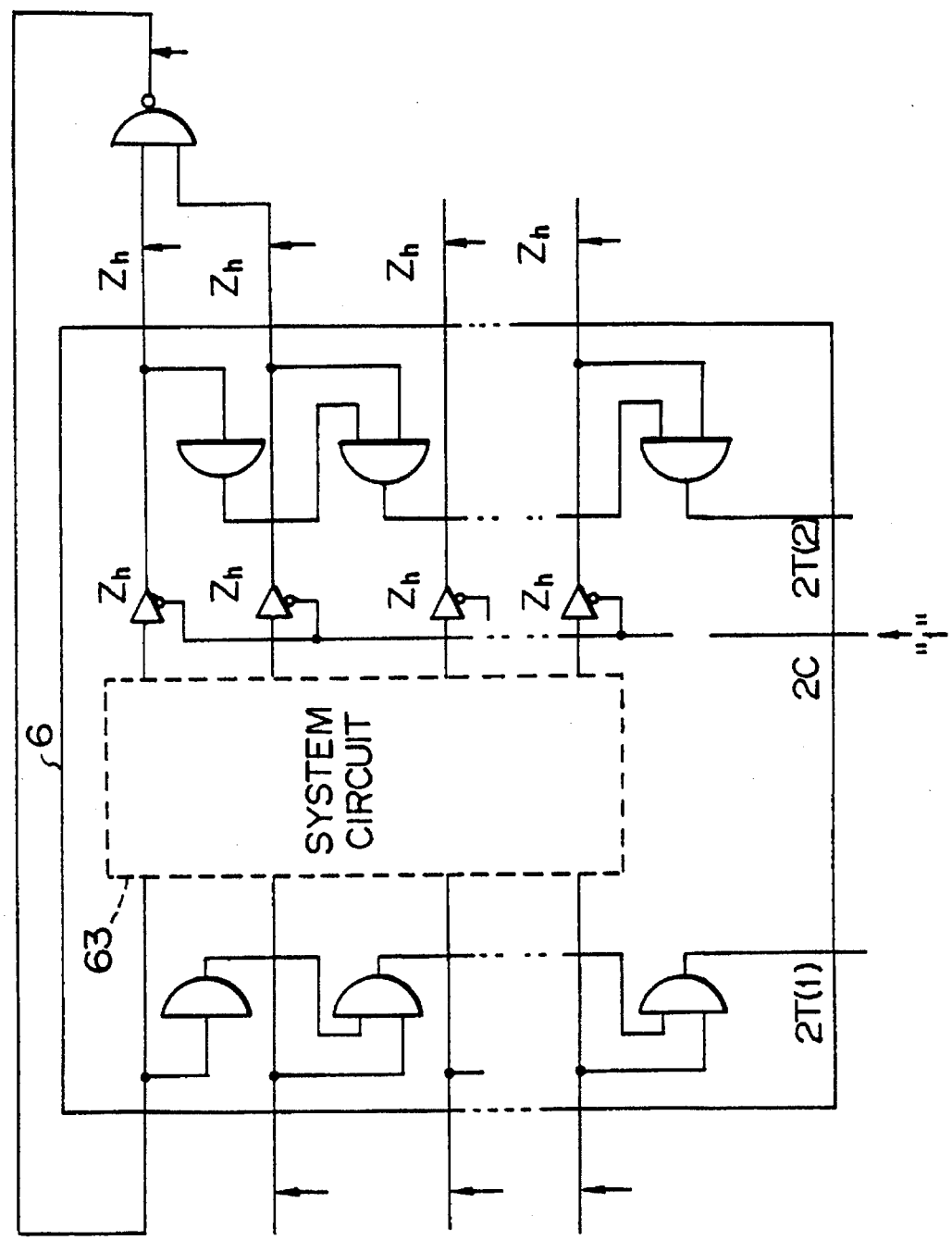

As shown in FIG. 17, the signal "1" is supplied through the test control external pin 2C, hence the tristate buffers, serving as switch circuits, are placed in high impedance states $Z_h$. Accordingly, all of the output side external pins are placed in a high impedance state $Z_h$. Then, a pull-up resistor and a pull-down resistor are alternately connected to the output side external pins through probe pins and probe points corresponding to the probe pins, and the realizations of a potential level "1" and a potential level "0" in correspondence with the connections of the pull-up resistor and the pull-down resistor are checked.

After that, signals "1" are supplied in parallel to all of the input side external pins, and the output of a signal "1" through the input side test output external pin 2T(1) is checked. If the result of the check is affirmative, it is determined that the state of the connection in normal.

Figure 18:
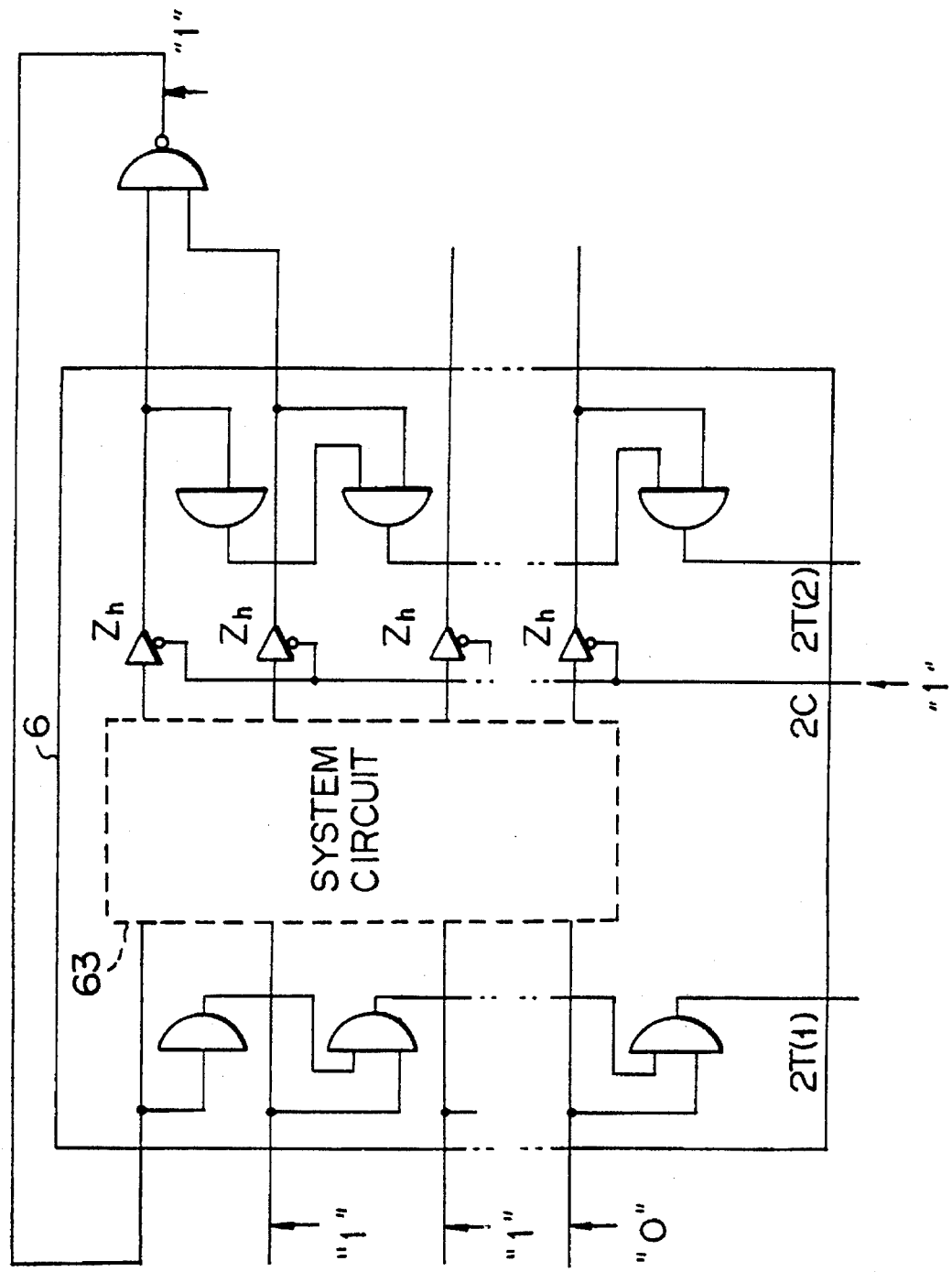

After that, as shown in FIG. 18, a signal "0" is supplied to an input side external pin in question, and the output of a signal "0" through the input side test output external pin 2T(1) is checked. If the result of the check is affirmative, it is determined that the state of the connection is normal. These processes are repeated for all of the input side external pins.

Figure 19:
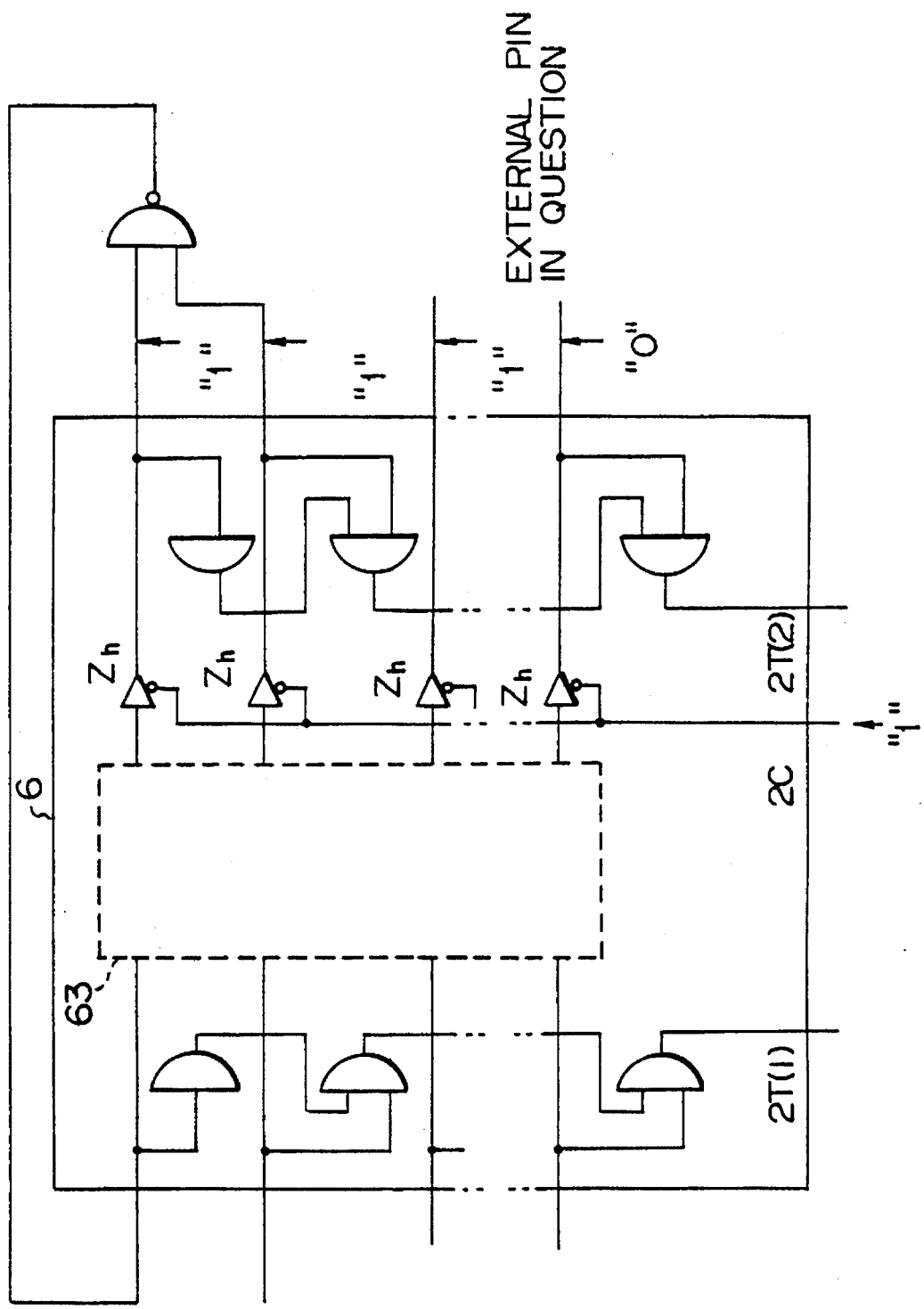

After that, similar processes are carried out for the output side external pins, as shown in FIG. 19.

Figure 20:
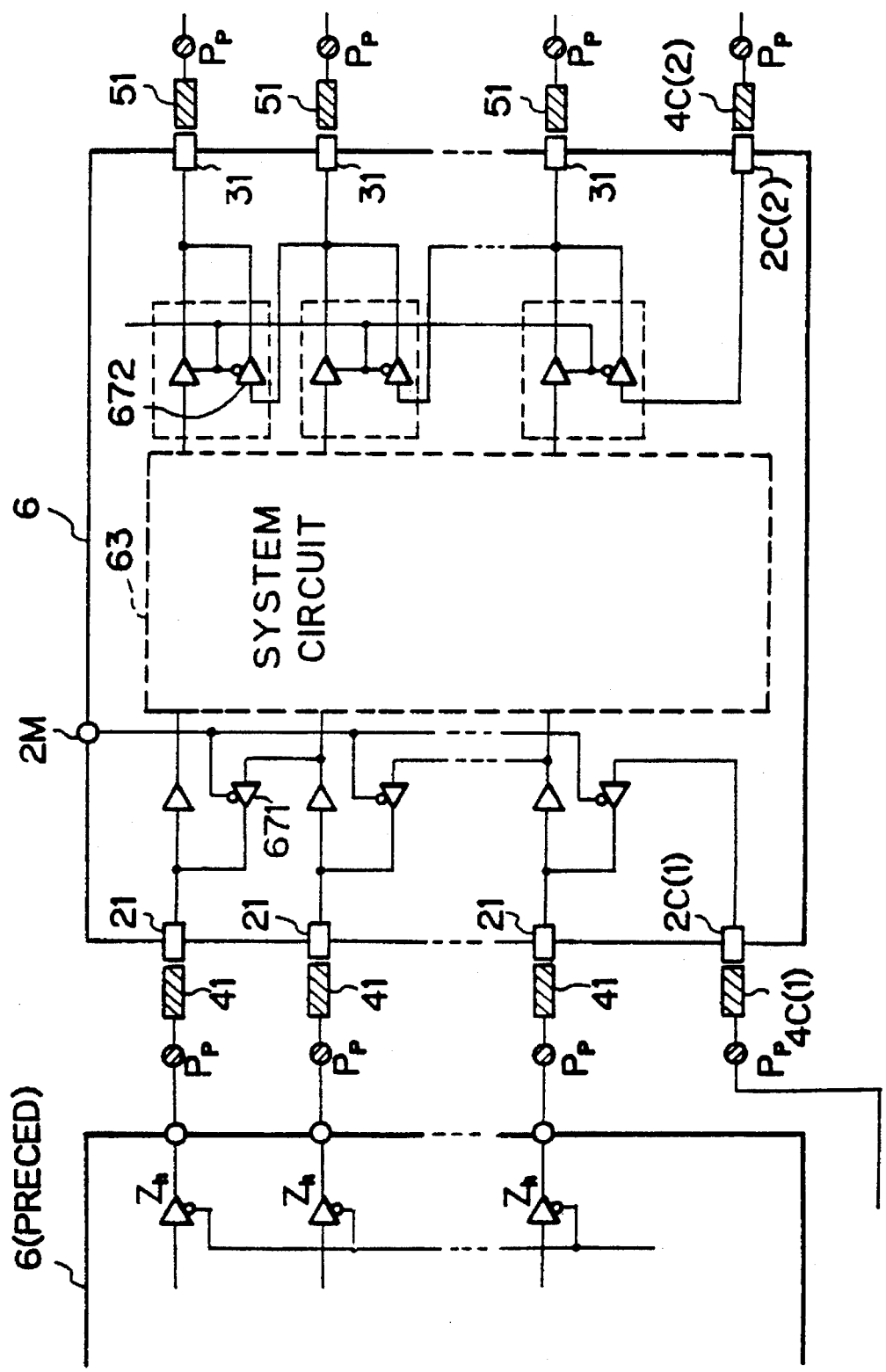

The device shown in FIG. 20, alternative embodiment of the present invention, is constituted by an integrated circuit 6, input side external pins 21, a system circuit 63, a switch circuit 67n, output side external pins 31, an input side test control pin 2C(1), an output side test control pin 2C(2), a neighborhood switch circuit 671, a connection selection circuit 672, and a test mode external pin 2M.

In the operation of the device of FIG. 20, the states of the output signals of the preceding semiconductor circuit element 6(PRECED) are fixed as high impedance states, the state of the test mode external pin 2M is set to be "0", i.e., the enable state of the test mode, and connections between neighboring input side external pins are realized.

For the test concerning the input side external pins, a signal "0", i.e., the enable state of the test mode, is supplied to the test control pin 2M to establish connections of the neighboring input side external pins.

Then, a test signal "0" is supplied through the probe pin corresponding to the input side test control external pin 2C(1), and the potential of the probe pin $P_p$ corresponding to the first input side external pin 21 is checked. If the connection between the first input side external pin 21 and the "foot print" corresponding thereto is normal, the potential "0" is to be detected at the probe pin $P_p$ corresponding to the first input side external pin 21.

After that, the potentials of the remaining probe pins $P_p$ corresponding to the remaining input side external pins are successively detected.

After that, the test signal "1" is supplied through the probe pin corresponding to the input side test control external pin 2C(1), and the potential of the probe pin $P_p$ corresponding to the first input side external pin 21 is checked. If the connection between the first input side external pin 21 and the "foot print" corresponding thereto is normal, the potential "1" is to be detected at the probe pin $P_p$ corresponding to the first input side external pin 21.

After that, the potentials of the remaining input side external pins are successively detected.

For the test of the output side external pins, a signal "0", i.e., the enable state of the test mode, is supplied to the test control pin 2M.

Then, a test signal "0" is supplied through the probe pin corresponding to the output side test control external pin 2C(2), and the potential of the probe pin $P_p$ corresponding to the first output side external pin 31 is checked. If the connection between the first output side external pin 31 and the "foot print" corresponding thereto is normal, the potential "0" is to be detected at the probe pin $P_p$ corresponding to the first output side external pin 31.

After that, the potentials of the remaining output side external pins are successively detected.

After that, a test signal "1" is supplied through the probe pin corresponding to the output side test control external pin 2C(2), and the potential of the probe pin $P_p$ corresponding to the first output side external pin 31 is checked. If the connection between the first output side external pin 31 and the "foot print" corresponding thereto is normal, the potential "1" is to be detected at the probe pin $P_p$ corresponding to the first output side external pin 31.

After that, the potentials of the remaining output side external pins are successively detected.

If abnormal states of connections are often detected in the course of the above described check, it may be assumed that a failure exists in the connection between the input or output side test control external pin and the probe pin corresponding thereto.

Figure 21:
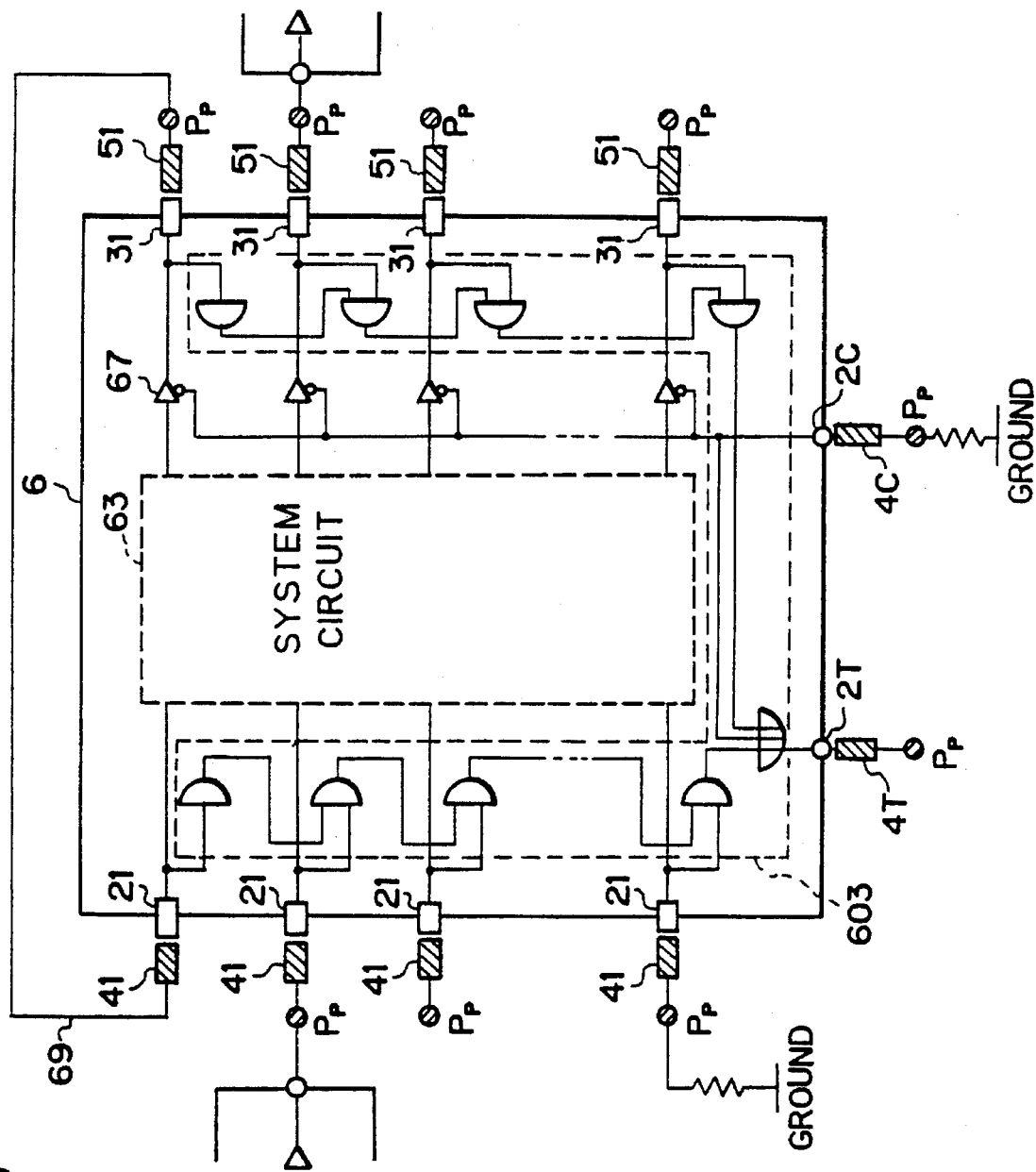

The device shown in FIG. 21, another alternative embodiment of the present invention, is constituted by input side external pins 21, "foot prints" 41 corresponding thereto, output side external pins 31, "foot prints" corresponding thereto, a system circuit 63, a test control external pin 2C, a "foot print" corresponding thereto, tri-state buffers 67 serving as the switching circuits, and a connection quality determination portion 603 including an OR gate combining the input side and the output side. The control signal supplied through the test control external pin 2C is supplied as one of the inputs of this OR gate. It is possible to test the state of connection between the test control external pin 2C and the "foot print" corresponding thereto by checking whether a signal "1" or "0" is output through the test output external pin 2T.

We claim:

1. A semiconductor circuit device having an arrangement for testing said semiconductor circuit device when mounted on a printed circuit board, said semiconductor circuit device comprising:

a plurality of connection pins, each of said connection pins to be connected to conductor connection portions of a printed circuit board, a system circuit, internal lines to be connected to said system circuit and to said connection pins, a plurality of first logic circuits provided in correspondence with internal line groups which are formed by grouping said internal lines into a plurality of groups, a plurality of internal lines belonging to a group in question constituting the input lines of said plurality of first logic circuits, for outputting an active output signal when all of the inputs represent active signals and outputting an inactive output signal when at least one of the inputs represents an inactive signal;

a second logic circuit constituted by one or more stages of circuit structures, for receiving the outputs of said first logic circuits and sending out an output signal so that the output signal when all of said inputs are inactive output signals is different from the output signal when at least one of said inputs is an active output signal;

wherein said arrangement for testing said semiconductor circuit device performs a group selection process for selecting one group as the group to be tested from the groups of internal lines;

inactive signal supply means for supplying an inactive signal through said conductor connecting portions of a printed circuit board to at least one internal line in the lines of the groups which are not selected in said group selection process;

active signal supply responsive output signal checking means for supplying active signals through said conductor connecting portions of a printed circuit board to the internal lines of the group selected in said group selection process and checking the signal output from the semiconductor circuit element in response to the supply of the active signals, and inactive signal supply responsive output signal checking means for selecting internal lines successively from the internal lines of the group selected in said group selection process, supplying inactive signals through said conductor connection portions of a printed circuit board to the selected internal lines, supplying active signals through said conductor connecting portions of a printed circuit board to the remaining internal lines, and checking the signal output from the semiconductor circuit element in response to the supply of the inactive and active signals.

2. A semiconductor circuit device having an arrangement for testing said semiconductor circuit device when mounted on a printed circuit board, said semiconductor circuit element comprising:

a plurality of connection pins, each of said connection pins to be connected to conductor connecting portions of a printed circuit board, a system circuit, internal lines to be connected to said system circuit and to said connection pins, a plurality of first logic circuits provided in correspondence with internal line groups which are formed by grouping said internal lines into a plurality of groups;

a plurality of internal lines belonging to a group in question constituting the input lines of said plurality of first logic circuits, for outputting an active output signal when all of the inputs represent active signals and outputting an inactive output signal when at least one of the inputs represents an inactive signal;

a second logic circuit constituted by one or more stages of circuit structures, for receiving the outputs of said first logic circuits and sending out an output signal so that the output signal when all of said inputs are inactive output signals is different from the output signal when at least one of said inputs is an active output signal;

a plurality of switch circuits arranged on the internal lines for operating to interrupt the connection between the system circuit and the first logic circuit in accordance with a control signal supplied through a control pin connected to the wiring connecting portion on the printed circuit board;

wherein said arrangement for testing said semiconductor circuit device performs a control signal supply process for supplying a control signal for interrupting the switch circuit to the conductor connecting portions connected with the control pin;

group selection means for selecting one group as the group to be tested from the groups of internal lines;

inactive signal supply means for supplying an inactive signal through said conductor connecting portions of a printed circuit board to at least one internal line in the lines of the groups which are not selected in said group selection process;

active signal supply responsive output signal checking means for supplying active signals through said conductor connecting portions of a printed circuit board to the internal lines in the groups selected in the group selection process and checking the output of the semiconductor circuit element which is sent out from the semiconductor circuit element in response to the supply of the active signals; and inactive signal supply responsive output signal checking means for selecting internal lines successively as internal lines to be tested from the internal lines of the group which is selected in the group selection process, supplying inactive signals through said conductor connection portions of a printed circuit board to the selected internal lines, supplying active signals through said conductor connecting portions of a printed circuit board to the remaining internal lines, and checking the signal output from the semiconductor circuit element in response to the supply of the inactive and active signals.

3. A semiconductor circuit element device with an arrangement for testing the device according to claim 2, wherein said second logic circuit receives a control signal supplied through a control pin and sends out an output signal so that the output signal in the case where all of the inputs are inactive output signals is different from the output signal in the case where at least one of the inputs is an active output signal.

4. A method of a test of a semiconductor circuit element device for testing the state of connection between external pins of a semiconductor circuit element and conductor connecting portions on a printed circuit board, by using a plurality of first logic circuits provided in correspondence with internal line groups which are formed by grouping said internal lines into a plurality of groups, a plurality of internal lines belonging to a group in question constituting the input lines of said plurality of first logic circuits, for outputting an active output signal when all of the inputs represent an active signals and outputting an inactive output signal when at least one of the inputs represents an inactive signal; and a second logic circuit constituted by one or more stages of circuit structures, for receiving the outputs of said first logic circuits and sending out an output signal so that the output signal in the case where all of said inputs are inactive output signals is different from the output signal in the case where at least one of said inputs is an active output signal, said method comprising:

a group selection process for selecting one group as the group to be tested from the groups of internal lines;

an inactive signal supply process for supplying an inactive signal through the conductor connecting portions to at least one internal line in the lines of the groups which are not selected in said group selection process;

an active signal supply responsive output signal checking process for supplying active signals through the conductor connecting portions to the internal lines of the group selected in said group selection process and checking the signal output from the semiconductor circuit element in response to the supply of the active signals; and an inactive signal supply responsive output signal checking process for selecting internal lines successively from the internal lines of the group selected in said group selection process, supplying inactive signals through the conductor connecting portions to the selected internal lines, supplying active signals through the conductor connecting portions to the remaining internal lines, and checking the signal output from the semiconductor circuit element in response to the supply of the active and inactive signals.

5. A method of a test of a semiconductor circuit element device for testing the state of a connection between an external pin or control pin of a semiconductor circuit element and conductor connecting portions on a printed circuit board, by using a plurality of first logic circuits provided in correspondence with internal line groups which are formed by grouping said internal lines into a plurality of groups, a plurality of internal lines belonging to a group in question constituting the input lines of said plurality of first logic circuits, for outputting an active output signal when all of the inputs represent an active signals and outputting an inactive output signal when at least one of the inputs represents an inactive signal; a second logic circuit constituted by one or more stages of circuit structures, for receiving the outputs of said first logic circuits and sending out an output signal so that the output signal in the case where all of said inputs are inactive output signals is different from the output signal in the case where at least one of said inputs is an active output signal; and a plurality of switch circuits arranged on the internal lines for operating to interrupt the connection between the system circuit and the first logic circuit in accordance with a control signal supplied through a control pin connected to the wiring connecting portion on the printed circuit board, said method comprising:

a control signal supply process for supplying a control signal for interrupting the switch circuit to the conductor connecting portions connected with the control pin;

a group selection process for selecting one group as the group to be tested from the groups of internal lines;

an inactive signal supply process for supplying an inactive signal through the conductor connecting portions to at least one internal line in the internal lines of the groups which are not selected in the group selection process;

an active signal responsive output signal checking process for supplying active signals through the conductor connecting portions to the internal lines in the groups selected in the group selection process and checking the output of the semiconductor circuit element which is sent out from the semiconductor circuit element in response to the supply of the active signals; and an inactive signal supply responsive output signal checking process for selecting internal lines successively as internal lines to be tested from the internal lines of the group which is selected in the group selection process, supplying inactive signals through the conductor connecting portions to the selected internal lines, supplying active signals through the conductor connecting portions to the remaining internal lines, and checking the signal output from the semiconductor circuit element in response to the supply of the inactive and active signals.

6. A method of a test of a semiconductor circuit element device according to claim 5, further comprising a control pin/conductor connecting portion connection state testing process for testing the connection state between a control pin and the corresponding conductor connecting portion by supplying a control signal to the conductor connecting portion connected to the control pin, supplying a detection signal for enabling the detection of the operation state of the interruption through the conductor connecting portion to the external pin connected to the switch circuit, and checking the state of the signals at the external pin corresponding to the supply of the detection signal.

7. A method of a test of a semiconductor circuit element device according to claim 5, further comprising a control pin/conductor connecting portion connection state testing process for testing the connection state between a control pin and the corresponding conductor connecting portion by supplying an inactive signal through the conductor connecting portion to at least one internal line in the internal lines belonging to the groups of the internal lines, supplying alternately a control signal for the interruption and a control signal for the non-interruption of the switch circuit to the conductor connecting portion connected to the control pin, and checking the output signal sent out from the semiconductor circuit element in response to the supply of the control signals.

8. A method of a test of a semiconductor circuit element device according to claim 4, wherein the connection between a semiconductor testing device for supplying an active/inactive signal to the semiconductor circuit element through the conductor connecting portion and the external pin of the semiconductor circuit element is such that one internal line in the internal lines of the groups is connected, in an independent form, to the semiconductor testing device, and the semiconductor testing device supplies an inactive signal which is requested to be supplied to the internal line in the group which is not selected as the group to be tested through the conductor connecting portion connected in an independent form.

9. A method of a test of a semiconductor circuit element device according to claim 5, wherein the connection between a semiconductor testing device for supplying an active/inactive signal to the semiconductor circuit element through the conductor connecting portion and the external pin of the semiconductor circuit element is such that one internal line in the internal lines of the groups is connected, in an independent form, to the semiconductor testing device, and the semiconductor testing device supplies an inactive signal which is requested to be supplied to the internal line in the group which is not selected as the group to be tested through the conductor connecting portion connected in an independent form.

10. A semiconductor integrated circuit device having an arrangement for testing the device comprising:

a plurality of connection pins, each connection pin comprising an input pin;

input pins to be connected to a plurality of end portions of conductors on a printed circuit board;

an internal circuit for receiving input signals, processing the received signals, and outputting the processed signals;

a test terminal coupled to said end portions of conductors on a printed circuit board, for providing a test signal;

connection quality determination means for determining a quality of connection between said plurality of end portions of conductors on a printed circuit board and said input pins, based on a test signal which is supplied through said test terminal and input through said end portions of conductors on a printed circuit board and said input pins;

wherein said test terminal and said connection quality determination means are coupled to said input pins.

11. A semiconductor integrated circuit device having an arrangement for testing the device comprising:

a plurality of connection pins, each connection pin comprising an output pin;

output pins to be connected to a plurality of end portions of conductors on a printed circuit board;

an internal circuit for receiving input signals, processing the received signals, and outputting the processed signals;

a test terminal coupled to said end portions of conductors on a printed circuit board, for providing a test signal;

connection quality determination means for determining a quality of connection between said plurality of end portions of conductors on a printed circuit board and said output pins, based on a test signal which is supplied through said test terminal and input through said end portions of conductors on a printed circuit board and said output pins;

wherein said test terminal and said connection quality determination means are coupled to said output pins; and an output switch portion provided between said internal circuit and said output pins for connecting said internal circuit and said output pins in the usual operation state and for interrupting the connection between said internal circuit and said output pins in the case of receiving an instruction of a quality test.

12. A semiconductor integrated circuit device having an arrangement for testing the device comprising:

a plurality of connection pins, each connection pin comprising an input pin;

a test terminal coupled to said end portions of conductors on a printed circuit board, for providing a test signal;

input pins to be connected to a plurality of end portions of conductors on a printed circuit board;

an internal circuit for receiving input signals, processing the received signals, and outputting the processed signals; and inter-pin switching means corresponding to said input pins for facilitating a test of the connection between said end portions of conductors and said input pins by interrupting the connections between adjacent input pins in the usual operation state, connecting the adjacent input pins in the case of receiving an instruction of a quality test, thereby detecting, at said test terminal coupled to said end portions of conductors on a printed circuit board, said test signal supplied through a test signal input terminal.

13. A semiconductor integrated circuit device having an arrangement for testing the device comprising:

output pins to be connected to a plurality of end portions of conductors on a printed circuit board;

test operation terminals coupled to said end portions of conductors on a printed circuit board for receiving test operation signals;

an internal circuit for receiving input signals, processing the received signals, and outputting the processed signals; and connection quality determination means for testing a connection between said end portions of conductors and said output pins by selecting the connection between said internal circuit and said output pins in the usual operation state and selecting the connection between adjacent output pins in the case of receiving an instruction of a quality test, and for detecting, at said test operation terminals, said test operation signals supplied through said test operation terminals.

14. A semiconductor integrated circuit device with a system circuit and an arrangement for testing the semiconductor integrated circuit device when mounted on a printed circuit board having a plurality of conductors, said semiconductor integrated circuit device comprising:

a plurality of connection pins respectively corresponding to the plurality of conductors on the printed circuit board, each said connection pin comprising one of an input pin for receiving an input signal and an output pin for outputting a processed signal;

connection quality determination means for determining a quality of connection between said plurality of conductors and said plurality of respective and corresponding connection pins, said connection quality determination means determining the quality of connection based on a required relationship of selected said input signals and corresponding and selected processed signals as output through respective connection pins; and internal lines, respectively corresponding to and interconnecting the connection pins, the system circuit and the connection quality determination means, for transmitting signals therebetween.

15. A semiconductor circuit element device with an arrangement for testing the device, as recited in claim 14, further comprising:

a test terminal coupled to the conductors, for providing a test signal; and wherein said connection quality determination means determines the quality of connection between said plurality of conductors and said connection pins, based on the test signal supplied through the test terminal and the processed test signal.

16. A semiconductor circuit element device with an arrangement for testing the device, as recited in claim 15, wherein:

said test terminal and said connection quality determination means are coupled to the plurality of input pins of said connection pins.

17. A semiconductor integrated circuit device with an arrangement for testing the device as recited in claim 15, wherein said connection pins are output pins connected to the plurality of conductors on the printed circuit board; and further comprising output switch means, provided between said internal lines and said output pins, for connecting said internal lines and said output pins in a usual operation state, and for interrupting said connection, between said internal lines and said output pins, in response to an instruction of a connection quality test.

18. A semiconductor integrated circuit device with an arrangement for testing the device as recited in claim 16, said connection quality determination means further comprising:

test operation terminals coupled to the conductors corresponding to input pins, for receiving test operation signals; and said connection quality determination means further comprising:

inter-pin switch means, responsive to a control signal, corresponding to said input pins, for testing the connection between said plurality of conductors and said input pins by interrupting the connection between adjacent input pins when the control signal indicates a usual operation state, and connecting adjacent input pins when said control signal indicates a connection quality test state, and for detecting, at corresponding test operation terminals, said corresponding test operation signals.

19. A semiconductor integrated circuit device with an arrangement for testing the device as recited in claim 15, further comprising:

test operation terminals coupled to the conductors corresponding to output pins, for receiving test operation signals and wherein:

said output pins of said connection pins are connected to the plurality of conductors on the printed circuit board; and said connection quality determination means, responsive to a control signal, tests the connection between said conductors and corresponding output pins by selecting said connection between said system circuit and said output pins when the control signal is indicative of the usual operation state and selecting said connection between adjacent output pins when the control signal is indicative of a connection quality test, and for detecting, at corresponding test operation terminals, said test operation signal supplied through said corresponding test operation terminals.

20. A semiconductor integrated circuit device as recited in claim 14, wherein said internal lines are grouped into a plurality of internal line groups, each internal line group comprising a plurality of internal lines; and said connection quality determination means is coupled to said internal lines and said system circuit and further comprises:

a plurality of first logic circuits, each of said first logic circuits coupled to a corresponding one of the internal line groups, said internal line groups supplying first logic input signal to said plurality of first logic circuits, and said plurality of first logic circuits each outputting a first logic output signal, representative of an active signal when all of the said first logic input signals are representative of active signals and outputting a first output signal representative of an inactive signal when at least one of said first logic input signals is representative of an inactive signal, a second logic circuit, comprised of at least one stage of circuit structures, for receiving said first logic output signals from said plurality of first logic circuits, and producing a second logic output signal representative of a first state when all of said received first logic output signals are representative of inactive signals and producing a second logic output signal representative of a second state when at least one of said received first logic output signals is representative of an active signal, group selection means for selecting one of said internal line groups for testing, inactive signal supply means for supplying an input signal representative of an inactive signal, through said conductors, to at least one of said internal lines of each internal line group which is not selected by said group selection means, an active signal supply responsive output signal checking means for supplying input signals representative of active signals, through said conductors, to said internal lines of said selected internal line group and checking said second logic output signal in response to the supply of the input signals, and inactive signal supply responsive output signal checking means for selecting internal lines successively, from said selected internal line group, supplying input signals representative of inactive signals through said conductors to said selected internal lines, supplying input signals representative of active signals through said conductors to said internal lines not selected, and checking said second logic output signal in response to the supply of input signals.

21. A semiconductor circuit element device as recited in claim 20, said connection quality determination means further comprising:

a plurality of switch circuits, responsive to a control signal supplied through a control pin connected to at least one of said conductors on the printed circuit board, each said plurality switch circuit coupled to a corresponding first logic circuits and said system circuit, and each switch circuit operating to interrupt the connection between said system circuit and the corresponding first logic circuit in response to the control signal; and control signal supply means for supplying the control signal to each of said plurality of switch circuits.

22. A semiconductor circuit element device with an arrangement for testing the device according to claim 21, wherein said second logic circuit receives the control signal, and wherein said second logic circuit outputs said second logic output signal representative of a first state when all of the received said first logic output signals are representative of inactive signals and outputs said second logic signal representative of a second state when at least one of the received said first logic output signals is representative of an active signal.

23. A semiconductor integrated circuit device as recited in claim 20, wherein said first logic circuits are AND gates; and said second logic circuit is an OR gate.

24. A method for testing a connection state between connection pins of a semiconductor circuit device and a plurality of conductors on a printed circuit board, said semiconductor circuit device having a plurality of connection pins, each one of the connection pins coupled to a corresponding conductor, a system circuit, internal lines coupled to the system circuit and the connection pins, said internal lines grouped into a plurality of internal line groups, each said internal line group comprised of a plurality of internal lines, a plurality of first logic circuits, each of said first logic circuits, coupled to a corresponding one of the internal line groups, receiving input signals from the corresponding internal line group and outputting a first logic output signal representative of an active signal when the first logic input signal, received by the corresponding circuit, are representative of active signals and outputting a first logic output signal representative of an inactive signal when at least one of the input signals, received by the corresponding first logic circuit, is representative of an inactive signal, and a second logic circuit of at least one stage of circuit structures, for receiving each of the first logic output signals from said plurality of first logic circuits and producing a second logic circuit output signal representative of a first state when all of said first logic output signals are representative of inactive signals, and is producing second logic circuit output signal representative of a second state when at least one of said first logic output signals is representative of an active output signal, said method comprising:

a group selection process for selecting one of said internal line groups to test;

an inactive signal supply process for supplying input signals representative of inactive signals through the conductors, to at least one of the internal lines in each internal line group which is not selected by said group selection process;

an active signal supply responsive output signal checking process for supplying active signals, through the conductors, to the each said internal line of said internal line group selected in said group selection process, and checking said second logic circuit output signal in response to the supply of input signals; and an inactive signal supply responsive output signal checking process for selecting successively, one of said internal lines from said internal line group selected in said group selection process, supplying an input signal representative of an inactive signal, through a corresponding one of the conductors to the selected internal line, supplying input signals representative of active signals through the conductors corresponding to said internal lines not selected, and checking said second logic circuit output signal in response to the supply of the input signals.

25. A method of a test of a semiconductor circuit device as recited in claim 24, further comprising:

an interrupter process, responsive to a control signal, supplied through a control pin the control pin being one of said external pins connected to one of the conductors on the printed circuit board, said interrupter process for interrupting connections between said system circuit and said plurality of first logic circuits, by using a plurality of switches, controlled by the control signal, arranged on said internal lines, and a control signal supply process for supplying said control signal to each of the plurality of switch circuits.

26. A method of a test of a semiconductor circuit element device according to claim 25, further comprising:

connection state testing process for testing a connection state between said control pin and a selected one of the conductors by supplying the control signal to the selected conductor, supplying a detection signal, representative of an operation state of the interrupter process, through the selected conductor to a corresponding connection pin connected to the corresponding switch circuit and checking the connection state represented by the detection signal.

27. A method of a test of a semiconductor circuit device according to claim 25, further comprising:

a connection state testing process for testing a connection state between said control pin and a selected one of the conductors, by supplying an input signal representative of an inactive signal, through said selected conductor to at least one of the internal lines belonging to each said internal line group, alternately supplying the control signal to cause corresponding switches to interrupt the connections and not interrupt the connections, and checking the second logic circuit output signal in response to the supply of said control signal.

28. A method of testing a semiconductor circuit device according to claim 24, wherein a connection between a semiconductor testing device for supplying test signals representative of active and inactive signals to each of said internal lines, through said semiconductor circuit element, said conductors and said connection pins, is such that one of said internal lines in each corresponding internal line group is connected, in an independent form, to said semiconductor testing device, and said semiconductor testing device supplies inactive test signals when said corresponding internal line group is not selected as the internal line group to be tested through corresponding conductors connected in an independent form.

29. A method of testing a semiconductor circuit device according to claim 25, wherein a connection between a semiconductor testing device for supplying test signals representative of active and inactive signals to each of said internal lines, through, said semiconductor circuit element said conductors and said connection pins, is such that one of said internal lines in each corresponding internal line group is connected, in an independent form, to said semiconductor testing device, and said semiconductor testing device supplies inactive test signals to one of internal lines in said internal line group which is not selected as said internal line group to be tested, through said conductors connected in an independent form.

30. A semiconductor integrated circuit device having a system circuit, a plurality of connection pins, internal lines respectively corresponding to and connecting the connection pins and the system circuit for transmitting signals therebetween, said semiconductor integrated circuit device being mounted on a printed circuit board having a plurality of conductors and said plurality of conductors respectively corresponding to the plurality of connection pins, said semiconductor integrated circuit device comprising:

connection quality determination means for determining a quality of connection between said plurality of conductors and said plurality of said respective and corresponding connection pins, comprising one of:

a test terminal, coupled to the plurality of conductors, for providing a test signal to the plurality of connection pins which are coupled to internal circuitry for receiving said test signal, processing said received test signal and outputting said processed test signal, and output determination means for determining, based on the output processed signal, the quality of connection;

a test terminal, coupled to the plurality of conductors, for providing a test signal to the plurality of connection pins which are coupled to internal circuitry for receiving said test signal, processing said received test signal and outputting said processed test signal, switch means, coupled to selected ones of said connection pins and said internal circuitry, responsive to a control signal, said switch means connecting said system circuit and said selected connection pins when the control signal is indicative of a usual operation state, and interrupting the connection between said system circuit and said selected connection pins when the control signal is indicative of a connection quality test state and output determination means for determining, based on the output processed signal, the quality of connection;

test operation terminals, coupled to the plurality of conductors, for providing test operation signals to the plurality of connection pins which are coupled to internal circuitry for receiving said test operation signals, processing said received test operation signals, and outputting said processed test operation signals, inter-pin switch means, coupled to selected ones of said connection pins and said internal circuitry, responsive to a control signal, said inter-pin switch means interrupting the connection between adjacent selected connection pins when the control signal indicates a usual operation state, and connecting adjacent selected connection pins when said control signal indicates a connection quality test state, and for detecting at corresponding test operation terminals, said corresponding test operation signals and output determination means for determining, based on the output processed signal, the quality of connection;

test operation terminals, coupled to the plurality of conductors, for providing test operation signals to the plurality of connection pins which are coupled to internal circuitry for receiving said test operation signals, processing said received test operation signals, and outputting said processed test operation signals, said internal circuitry selecting the connection between adjacent connection pins when the control signal indicates a usual operation state and selecting the connection between adjacent connection pins when said control signal indicates a connection quality test state and for detecting, at corresponding test operation terminals, said corresponding test operation signals, and output determination means for determining, based on the output processed signal, the quality of connection;

a plurality of first logic circuits, each of said first logic circuits coupled to a corresponding one of internal line groups, said internal line groups comprising a plurality of internal lines grouped into a plurality of internal line groups, said internal line group supplying first logic input signal to said plurality of first logic circuits, and said plurality of first logic circuits each outputting a first logic output signal, representative of an active signal when all of the said first logic input signals are representative of active signals and outputting a first output signal representative of an inactive signal when at least one of said first logic input signals is representative of an inactive signal, a second logic circuit, comprised of at least one stage of circuit structures, for receiving said first logic output signals from said plurality of first logic circuits, and producing a second logic output signal representative of a first state when all of said received first logic output signals are representative of inactive signals and producing a second logic output signal representative of a second state when at least one of said received first logic output signals is representative of an active signal, group selection means for selecting one of said internal line groups for testing, inactive signal supply means for supplying an input signal representative of an inactive signal, through said conductors, to at least one of said internal lines of each internal line group which is not selected by said group selection means, an active signal supply responsive output signal checking means for supplying input signals representative of active signals, through said conductors, to said internal lines of said selected internal line group and checking said second logic output signal in response to the supply of the input signals, and inactive signal supply responsive output signal checking means for selecting internal lines successively, from said selected internal line group, supplying input signals representative of inactive signals through said conductors to said selected internal lines, supplying input signals representative of active signals through said conductors to said internal lines not selected and checking said second logic output signal in response to the supply of input signals;

a plurality of first logic circuits, each of said first logic circuits coupled to a corresponding one of internal line groups, said internal line groups comprising a plurality of internal lines grouped into a plurality of internal line groups, said internal line group supplying first logic input signal to said plurality of first logic circuits, and said plurality of first logic circuits each outputting a first logic output signal, representative of an active signal when all of the said first logic input signals are representative of active signals and outputting a first output signal representative of an inactive signal when at least one of said first logic input signals is representative of an inactive signal, a second logic circuit, comprised of at least one stage of circuit structures, for receiving said first logic output signals from said plurality of first logic circuits, and producing a second logic output signal representative of a first state when all of said received first logic output signals are representative of inactive signals and producing a second logic output signal representative of a second state when at least one of said received first logic output signals is representative of an active signal, group selection means for selecting one of said internal line groups for testing, inactive signal supply means for supplying an input signal representative of an inactive signal, through said conductors, to at least one of said internal lines of each internal line group which is not selected by said group selection means, an active signal supply responsive output signal checking means for supplying input signals representative of active signals, through said conductors, to said internal lines of said selected internal line group and checking said second logic output signal in response to the supply of the input signals, inactive signal supply responsive output signal checking means for selecting internal lines successively, from said selected internal line group, supplying input signals representative of inactive signals through said conductors to said selected internal lines, supplying input signals representative of active signals through said conductors to said internal lines not selected, and checking said second logic output signal in response to the supply of input signals, and a plurality of switch circuits, responsive to a control signal supplied through a control pin connected to at least one of said conductors on the printed circuit board, each said plurality switch circuit coupled to a corresponding first logic circuits and said system circuit, and each switch circuit operating to interrupt the connection between said system circuit and the corresponding first logic circuit in response to the control signal; and control signal supply means for supplying the control signal to each of said plurality of switch circuits; and a plurality of first logic circuits, each of said first logic circuits coupled to a corresponding one of internal line groups, said internal line groups comprising a plurality of internal lines grouped into a plurality of internal line groups, said internal line group supplying first logic input signal to said plurality of first logic circuits, and said plurality of first logic circuits each outputting a first logic output signal, representative of an active signal when all of the said first logic input signals are representative of active signals and outputting a first output signal representative of an inactive signal when at least one of said first logic input signals is representative of an inactive signal, a second logic circuit, comprised of at least one stage of circuit structures, for receiving said first logic output signals from said plurality of first logic circuits, and producing a second logic output signal representative of a first state when all of said received first logic output signals are representative of inactive signals and producing a second logic output signal representative of a second state when at least one of said received first logic output signals is representative of an active signal, group selection means for selecting one of said internal line groups for testing, inactive signal supply means for supplying an input signal representative of an inactive signal, through said conductors, to at least one of said internal lines of each internal line group which is not selected by said group selection means, an active signal supply responsive output signal checking means for supplying input signals representative of active signals, through said conductors, to said internal lines of said selected internal line group and checking said second logic output signal in response to the supply of the input signals, inactive signal supply responsive output signal checking means for selecting internal lines successively, from said selected internal line group, supplying input signals representative of inactive signals through said conductors to said selected internal lines, supplying input signals representative of active signals through said conductors to said internal lines not selected, and checking said second logic output signal in response to the supply of input signals, and a plurality of switch circuits, responsive to a control signal supplied through a control pin connected to at least one of said conductors on the printed circuit board, each said plurality switch circuit coupled to a corresponding first logic circuits and said system circuit, and each switch circuit operating to interrupt the connection between said system circuit and the corresponding first logic circuit in response to the control signal; and control signal supply means for supplying the control signal to each of said plurality of switch circuits; and wherein said second logic circuit receives the control signal, and wherein said second logic circuit outputs said second logic output signal representative of a first state when all of the received said first logic output signals are representative of inactive signals and outputs said second logic signal representative of a second state when at least one of the received said first logic output signals is representative of an active signal.

31. A semiconductor integrated circuit device having a system circuit, a plurality of connection pins, internal lines respectively corresponding to and connecting the connection pins and the system circuit for transmitting signals therebetween, said semiconductor integrated circuit device being mounted on a printed circuit board having a plurality of conductors and said plurality of conductors respectively corresponding to the plurality of connection pins, said semiconductor integrated circuit device comprising:

connection quality determination means for determining in a sequence of tests, in any order, a quality of connection between said plurality of conductors and said plurality of said respective and corresponding connection pins, said connection quality determination means further comprising:

in a first test, a test terminal, coupled to the plurality of conductors, for providing a test signal, internal circuitry for receiving said test signal, processing said received test signal and outputting said processed test signal, and output determination means for determining, based on the output processed signal, the quality of connection;

in a second test, a test terminal, coupled to the plurality of conductors, for providing a test signal, internal circuitry for receiving said test signal, processing said received test signal and outputting said processed test signal, switch means, coupled to selected ones of said connection pins and said internal circuitry, responsive to a control signal, said switch means connecting said system circuit and said selected connection pins when the control signal is indicative of a usual operation state, and interrupting the connection between said system circuit and said selected connection pins when the control signal is indicative of a connection quality test state and output determination means for determining, based on the output processed signal, the quality of connection;

in a third test, test operation terminals, coupled to the plurality of conductors, for providing test operation signals, internal circuitry for receiving said test operation signals, processing said received test operation signals, and outputting said processed test operation signals, inter-pin switch means, coupled to selected ones of said connection pins and said internal circuitry, responsive to a control signal, said inter-pin switch means interrupting the connection between adjacent selected connection pins when the control signal indicates a usual operation state, and connecting adjacent selected connection pins when said control signal indicates a connection quality test state, and for detecting at corresponding test operation terminals, said corresponding test operation signals and output determination means for determining, based on the output processed signal, the quality of connection;

in a fourth test, test operation terminals, coupled to the plurality of conductors, for providing test operation signals, internal circuitry for receiving said test operation signals, processing said received test operation signals, and outputting said processed test operation signals, said internal circuitry selecting the connection between adjacent connection pins when the control signal indicates a usual operation state and selecting the connection between adjacent connection pins when said control signal indicates a connection quality test state and for detecting, at corresponding test operation terminals, said corresponding test operation signals, and output determination means for determining, based on the output processed signal, the quality of connection;

in a fifth test, a plurality of first logic circuits, each of said first logic circuits coupled to a corresponding one of internal line groups, said internal line groups comprising a plurality of internal lines grouped into a plurality of internal line groups, said internal line group supplying first logic input signal to said plurality of first logic circuits, and said plurality of first logic circuits each outputting a first logic output signal, representative of an active signal when all of the said first logic input signals are representative of active signals and outputting a first output signal representative of an inactive signal when at least one of said first logic input signals is representative of an inactive signal, a second logic circuit, comprised of at least one stage of circuit structures, for receiving said first logic output signals from said plurality of first logic circuits, and producing a second logic output signal representative of a first state when all of said received first logic output signals are representative of inactive signals and producing a second logic output signal representative of a second state when at least one of said received first logic output signals is representative of an active signal, group selection means for selecting one of said internal line groups for testing, inactive signal supply means for supplying an input signal representative of an inactive signal, through said conductors, to at least one of said internal lines of each internal line group which is not selected by said group selection means, an active signal supply responsive output signal checking means for supplying input signals representative of active signals, through said conductors, to said internal lines of said selected internal line group and checking said second logic output signal in response to the supply of the input signals, and inactive signal supply responsive output signal checking means for selecting internal lines successively, from said selected internal line group, supplying input signals representative of inactive signals through said conductors to said selected internal lines, supplying input signals representative of active signals through said conductors to said internal lines not selected and checking said second logic output signal in response to the supply of input signals;

in a sixth test, a plurality of first logic circuits, each of said first logic circuits coupled to a corresponding one of internal line groups, said internal line groups comprising a plurality of internal lines grouped into a plurality of internal line groups, said internal line group supplying first logic input signal to said plurality of first logic circuits, and said plurality of first logic circuits each outputting a first logic output signal, representative of an active signal when all of the said first logic input signals are representative of active signals and outputting a first output signal representative of an inactive signal when at least one of said first logic input signals is representative of an inactive signal, a second logic circuit, comprised of at least one stage of circuit structures, for receiving said first logic output signals from said plurality of first logic circuits, and producing a second logic output signal representative of a first state when all of said received first logic output signals are representative of inactive signals and producing a second logic output signal representative of a second state when at least one of said received first logic output signals is representative of an active signal, group selection means for selecting one of said internal line groups for testing, inactive signal supply means for supplying an input signal representative of an inactive signal, through said conductors, to at least one of said internal lines of each internal line group which is not selected by said group selection means, an active signal supply responsive output signal checking means for supplying input signals representative of active signals, through said conductors, to said internal lines of said selected internal line group and checking said second logic output signal in response to the supply of the input signals, inactive signal supply responsive output signal checking means for selecting internal lines successively, from said selected internal line group, supplying input signals representative of inactive signals through said conductors to said selected internal lines, supplying input signals representative of active signals through said conductors to said internal lines not selected, and checking said second logic output signal in response to the supply of input signals, and a plurality of switch circuits, responsive to a control signal supplied through a control pin connected to at least one of said conductors on the printed circuit board, each said plurality switch circuit coupled to a corresponding first logic circuits and said system circuit, and each switch circuit operating to interrupt the connection between said system circuit and the corresponding first logic circuit in response to the control signal; and control signal supply means for supplying the control signal to each of said plurality of switch circuits; and in a seventh test, a plurality of first logic circuits, each of said first logic circuits coupled to a corresponding one of internal line groups, said internal line groups comprising a plurality of internal lines grouped into a plurality of internal line groups, said internal line group supplying first logic input signal to said plurality of first logic circuits, and said plurality of first logic circuits each outputting a first logic output signal, representative of an active signal when all of the said first logic input signals are representative of active signals and outputting a first output signal representative of an inactive signal when at least one of said first logic input signals is representative of an inactive signal, a second logic circuit, comprised of at least one stage of circuit structures, for receiving said first logic output signals from said plurality of first logic circuits, and producing a second logic output signal representative of a first state when all of said received first logic output signals are representative of inactive signals and producing a second logic output signal representative of a second state when at least one of said received first logic output signals is representative of an active signal, group selection means for selecting one of said internal line groups for testing, inactive signal supply means for supplying an input signal representative of an inactive signal, through said conductors, to at least one of said internal lines of each internal line group which is not selected by said group selection means, an active signal supply responsive output signal checking means for supplying input signals representative of active signals, through said conductors, to said internal lines of said selected internal line group and checking said second logic output signal in response to the supply of the input signals, inactive signal supply responsive output signal checking means for selecting internal lines successively, from said selected internal line group, supplying input signals representative of inactive signals through said conductors to said selected internal lines, supplying input signals representative of active signals through said conductors to said internal lines not selected, and checking said second logic output signal in response to the supply of input signals, and a plurality of switch circuits, responsive to a control signal supplied through a control pin connected to at least one of said conductors on the printed circuit board, each said plurality switch circuit coupled to a corresponding first logic circuits and said system circuit, and each switch circuit operating to interrupt the connection between said system circuit and the corresponding first logic circuit in response to the control signal; and control signal supply means for supplying the control signal to each of said plurality of switch circuits; and wherein said second logic circuit receives the control signal, and wherein said second logic circuit outputs said second logic output signal representative of a first state when all of the received said first logic output signals are representative of inactive signals and outputs said second logic signal representative of a second state when at least one of the received said first logic output signals is representative of an active signal.

\* \* \* \* \*